(12) United States Patent
Tsuzaki et al.

(10) Patent No.: US 11,877,045 B2
(45) Date of Patent: Jan. 16, 2024

(54) IMAGE-CAPTURING APPARATUS WITH A PLURALITY OF CAMERA MODULES AND A SUPPORT MEMBER IN WHICH AT LEAST ONE CAMERA MODULE IS FIXED TO THE SUPPORT MEMBER USING AN ADHESIVE, AND ELECTRONIC APPARATUS

(71) Applicant: SONY SEMICONDUCTOR SOLUTIONS CORPORATION, Kanagawa (JP)

(72) Inventors: Seiya Tsuzaki, Kumamoto (JP); Yasuhiro Hosokawa, Kumamoto (JP); Yoichiro Fujinaga, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 487 days.

(21) Appl. No.: 17/045,287

(22) PCT Filed: Feb. 5, 2019

(86) PCT No.: PCT/JP2019/004011
§ 371 (c)(1),
(2) Date: Oct. 5, 2020

(87) PCT Pub. No.: WO2019/198318
PCT Pub. Date: Oct. 17, 2019

(65) Prior Publication Data
US 2021/0152717 A1 May 20, 2021

(30) Foreign Application Priority Data
Apr. 11, 2018 (JP) .................................. 2018-076439

(51) Int. Cl.
*H04N 5/335* (2011.01)
*H04N 23/57* (2023.01)
(Continued)

(52) U.S. Cl.
CPC ............. *H04N 23/57* (2023.01); *H04N 23/45* (2023.01); *H04N 23/52* (2023.01); *H04N 23/55* (2023.01); *H05K 3/321* (2013.01)

(58) Field of Classification Search
CPC ....................................................... H04N 23/52
See application file for complete search history.

(56) References Cited

U.S. PATENT DOCUMENTS

| 2010/0079635 | A1 | 4/2010 | Yano et al. | |
|---|---|---|---|---|
| 2016/0150656 | A1* | 5/2016 | Mäki ................... | H04M 1/0266 361/679.01 |
| 2020/0021720 | A1* | 1/2020 | Wang .................... | H04N 23/50 |

FOREIGN PATENT DOCUMENTS

| CN | 101685188 A | 3/2010 |
|---|---|---|
| CN | 108886570 A | 11/2018 |

(Continued)

OTHER PUBLICATIONS

International Search Report and Written Opinion of PCT Application No. PCT/JP2019/004011, dated May 7, 2019, 10 pages of ISRWO.

*Primary Examiner* — Gary C Vieaux
(74) *Attorney, Agent, or Firm* — CHIP LAW GROUP

(57) ABSTRACT

To suppress a reduction in yield and to reduce production costs even when a failure has occurred with respect to the alignment and the like of a camera module in a multi-ocular configuration in which a plurality of camera modules is included. An image-capturing apparatus includes a plurality of camera modules; and a support member used to support the plurality of camera modules in a specified positional relationship, the image-capturing apparatus including a first camera module and at least one second camera module as the plurality of camera modules, the first camera module being fixed to the support member, the at least one second camera module being fixed to the support member using an (Continued)

adhesive portion formed of an adhesive that has a property of being released in a specific temperature range.

6 Claims, 19 Drawing Sheets

(51) Int. Cl.
  *H05K 3/32* (2006.01)
  *H04N 23/45* (2023.01)
  *H04N 23/52* (2023.01)
  *H04N 23/55* (2023.01)

(56) References Cited

FOREIGN PATENT DOCUMENTS

| | | | |
|---|---|---|---|
| EP | 3445033 A1 | | 2/2019 |
| JP | 63-201627 A | | 8/1988 |
| JP | 08-110433 A | | 4/1996 |
| JP | 2009-169123 A | | 7/2009 |
| JP | 2009-171413 A | | 7/2009 |
| JP | 2010-102313 A | | 5/2010 |
| JP | 2011-029867 A | | 2/2011 |
| JP | 2015-079618 A | | 4/2015 |
| JP | 2016-174218 A | | 9/2016 |
| JP | 2016174218 A | * | 9/2016 |
| KR | 10-2018-0134854 A | | 12/2018 |
| WO | 2017/179445 A1 | | 10/2017 |

* cited by examiner

IMAGE-CAPTURING APPARATUS WITH A PLURALITY OF CAMERA MODULES AND A SUPPORT MEMBER IN WHICH AT LEAST ONE CAMERA MODULE IS FIXED TO THE SUPPORT MEMBER USING AN ADHESIVE, AND ELECTRONIC APPARATUS

CROSS REFERENCE TO RELATED APPLICATIONS

This application is a U.S. National Phase of International Patent Application No. PCT/JP2019/004011 filed on Feb. 5, 2019, which claims priority benefit of Japanese Patent Application No. JP 2018-076439 filed in the Japan Patent Office on Apr. 11, 2018. Each of the above-referenced applications is hereby incorporated herein by reference in its entirety.

TECHNICAL FIELD

The present technology relates to an image-capturing apparatus, an electronic apparatus, and a method for producing the image-capturing apparatus. In particular, the present disclosure relates to a multi-ocular image-capturing apparatus that includes a plurality of camera modules, an electronic apparatus that includes the multi-ocular image-capturing apparatus, and a method for producing the image-capturing apparatus.

BACKGROUND ART

Conventionally, a multi-ocular image-capturing apparatus that includes a plurality of camera modules arranged to be supported in a specified positional relationship, is known as an image-capturing apparatus (for example, refer to Patent Literature 1). The camera module includes, for example, a solid-state imaging device such as a complementary metal-oxide semiconductor (CMOS) image sensor, and an optical system such as a lens unit that acts on light received by the solid-state imaging device. The multi-ocular image-capturing apparatus makes it possible to achieve optical zooming, high resolution, and high resolution in a dark place.

Patent Literature 1 discloses, as a multi-ocular image-capturing apparatus, a multi-ocular camera module having a configuration in which two monocular camera modules are supported by being fixed to a support member (a connection member) having a shape of a substantially rectangular frame. In such a configuration, the two monocular camera modules are fixed to the support member in a state of being arranged in parallel such that their optical axes are parallel to each other.

In the multi-ocular camera module disclosed in Patent Literature 1, each monocular camera module is fixed to the support member with screws. In other words, screw insertion holes are respectively formed in a specified frame making up the monocular camera module and in the support member, and a screw is threadably inserted into a screw hole formed by these insertion holes overlapping. This results in the monocular camera module being fastened and fixed to the support member.

CITATION LIST

Patent Literature

Patent Literature 1: WO2017/179445

DISCLOSURE OF INVENTION

Technical Problem

There exists a multi-ocular image-capturing apparatus having a configuration in which an adhesive is used to fix a camera module to a support member in order to align the camera module with respect to the support member. In other words, before the adhesive situated between the support member and the camera module is cured, the tilt, the position, and the like of the camera module with respect to the support member are adjusted on the basis of an optical axis and the like of the camera module.

The material costs and the assembling costs for a multi-ocular image-capturing apparatus are significantly expensive, compared to the case of a monocular camera module. For this reason, there is a reduction in yield when, for example, a failure has occurred with respect to the alignment and the like of a camera module described above, and this results in significantly increasing production costs. Specifically, when, for example, a failure has occurred in a state of a multi-ocular module in which a plurality of monocular camera modules is fixed to a support member, there is a need to take care of the entirety of the multi-ocular module as a defective product even if the monocular camera modules themselves are non-defective products. This is not favorable in terms of yield.

Further, regarding the production of a multi-ocular image-capturing apparatus, there is a need for a highly accurate alignment with respect to a specified reference when a plurality of camera modules is fixed, and the number of stages of the production process is increased. Thus, there is a problem in which the rate of the occurrence of a failure in the production process is higher than that of, for example, a monocular camera module. As described above, it is difficult to obtain a high yield in the production of a multi-ocular image-capturing apparatus.

An object of the present technology is to provide an image-capturing apparatus having a multi-ocular configuration in which a plurality of camera modules is included, an electronic apparatus, and a method for producing the image-capturing apparatus that make it possible to suppress a reduction in yield and to reduce production costs even when a failure has occurred with respect to the alignment and the like of the camera module.

Solution to Problem

An image-capturing apparatus according to the present technology includes a plurality of camera modules; and a support member used to support the plurality of camera modules in a specified positional relationship, the image-capturing apparatus including a first camera module and at least one second camera module as the plurality of camera modules, the first camera module being fixed to the support member, the at least one second camera module being fixed to the support member using an adhesive portion formed of an adhesive that has a property of being released in a specific temperature range.

In another aspect of the image-capturing apparatus according to the present technology, the specific temperature range may be from 85° C. to 100° C.

In another aspect of the image-capturing apparatus according to the present technology, the adhesive may have a photo-curable property; at least a portion, in the support member, to which the second camera module is fixed may include a first face portion and a second face portion, the adhesive being situated in a space between the first face portion and the second camera module, the first face portion and the second face portion forming a corner portion; and the image-capturing apparatus may further include a light guiding surface in the corner portion, the light guiding surface being used to guide light to the space between the first face portion and the second camera module, the light being used to cure the adhesive.

In another aspect of the image-capturing apparatus according to the present technology, a water-repellent portion may further be included on an edge of a region in at least one of the support member or the second camera module, the region being a region to which the adhesive is applied.

In another aspect of the image-capturing apparatus according to the present technology, a reinforcing resin portion formed of a resin material filled into a space between the support member and the camera module, may further be included, the space being provided with the adhesive portion; and the adhesive portion may be provided in discontinuous regions on a surface to which the second camera module is bonded.

An electronic apparatus according to the present technology includes an image-capturing apparatus including a plurality of camera modules, and a support member used to support the plurality of camera modules in a specified positional relationship, the image-capturing apparatus including a first camera module and at least one second camera module as the plurality of camera modules, the first camera module being fixed to the support member, the at least one second camera module being fixed to the support member using an adhesive portion formed of an adhesive that has a property of being released in a specific temperature range.

A method for producing an image-capturing apparatus according to the present technology includes fixing a first camera module to a support member used to support a plurality of camera modules in a specified positional relationship; fixing a second camera module to the support member using an adhesive that has a property of being released in a specific temperature range; performing an inspection for quality with respect to a multi-ocular module in which the first camera module and the second camera module are fixed to the support member, the quality including a state of attachment of the second camera module to the support member; when the multi-ocular module has been determined to be a non-defective product in the inspection, forming a reinforcing resin portion by filling a resin material into a space between the support member and the camera module; and when the multi-ocular module has been determined to be a defective product in the inspection, removing the second camera module from the support member by heating the adhesive portion at a temperature in the specific temperature range and by releasing the adhesive portion, and fixing the second camera module.

Advantageous Effects of Invention

The present technology makes it possible to suppress a reduction in yield and to reduce production costs even when a failure has occurred with respect to the alignment and the like of a camera module in a multi-ocular configuration in which a plurality of camera modules is included.

MODE(S) FOR CARRYING OUT THE INVENTION

The present technology improves yield and reduces production costs in a multi-ocular image-capturing apparatus that includes a plurality of camera modules by devising a method for fixing a camera module to a support member. Embodiments for implementing the present technology (hereinafter referred to as "embodiments") will now be described below with reference to the drawings.

The embodiments are described in the following order.
1. Configuration Example of Multi-ocular Image-Capturing Apparatus
2. Method for Producing Multi-ocular Image-Capturing Apparatus
3. Configuration Example of Each Component of Multi-ocular Image-Capturing Apparatus
4. Modification of Multi-ocular Image-Capturing Apparatus
5. Configuration Example of Electronic Apparatus <1. Configuration Example of Multi-Ocular Image-Capturing Apparatus>

Figure 1:
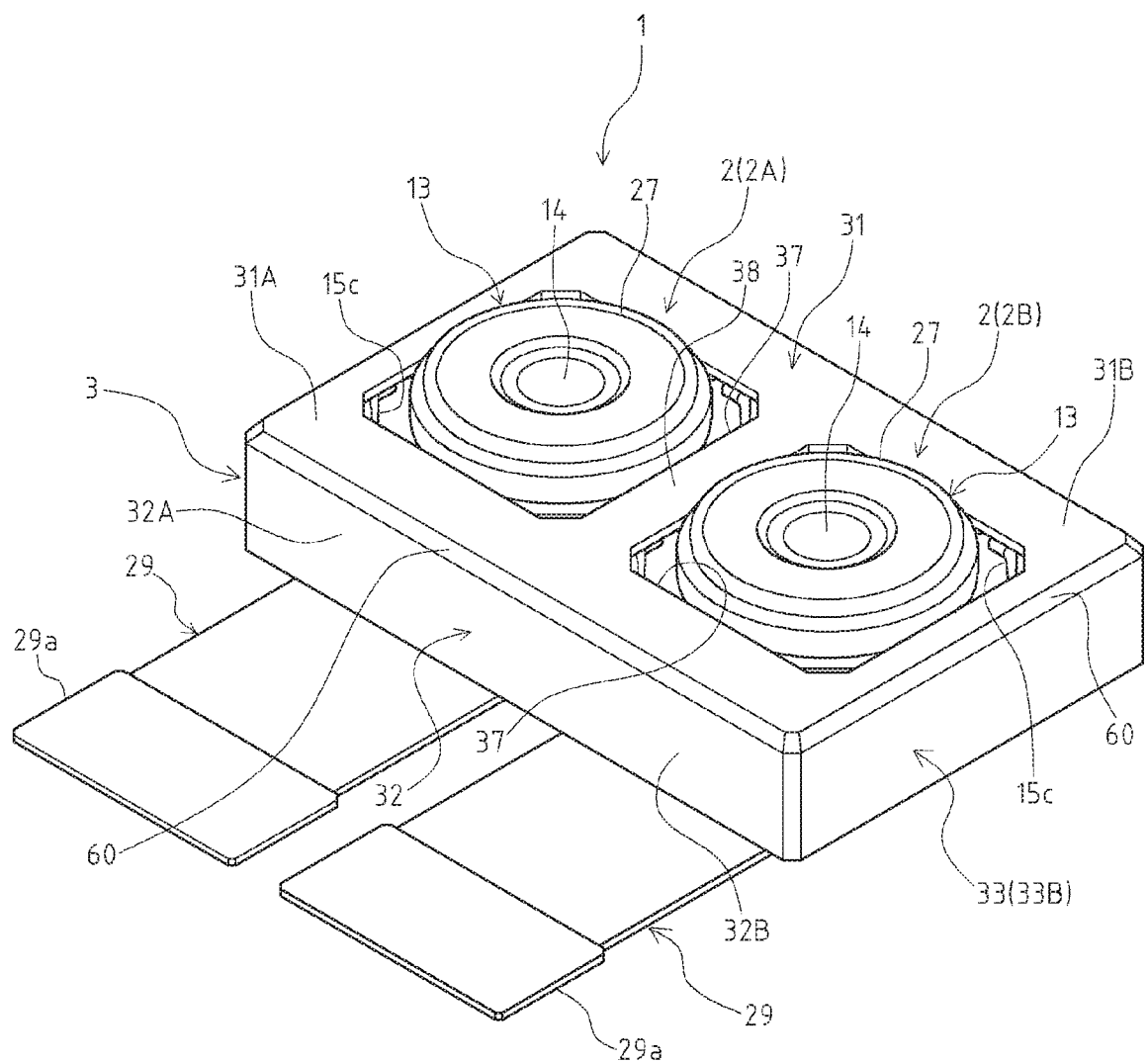
FIG. 1 is a perspective view illustrating an appearance of an image-capturing apparatus according to embodiments of the present technology.
Figure 2:
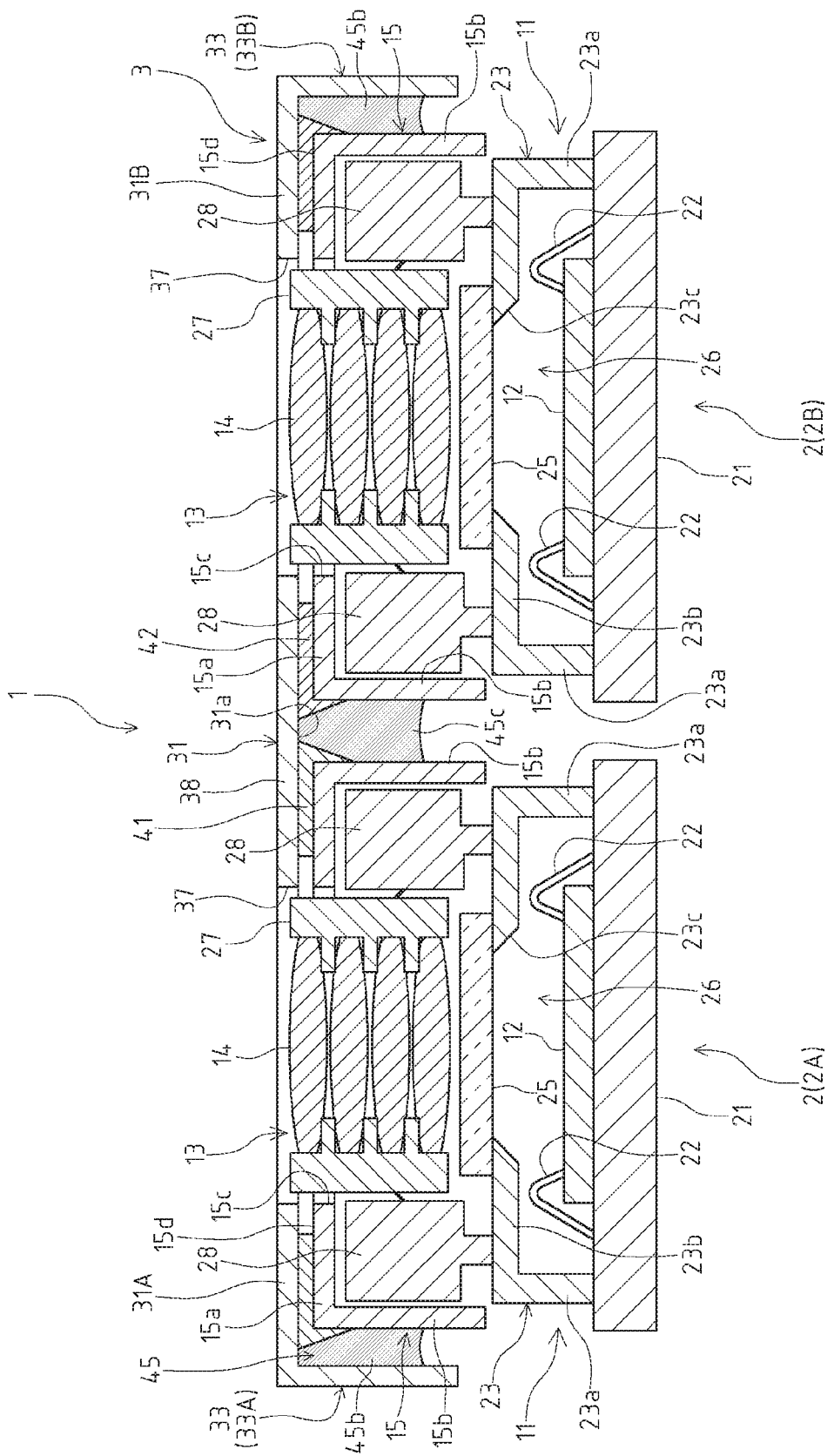
FIG. 2 is a cross-sectional view schematically illustrating a configuration of the image-capturing apparatus according to the embodiments of the present technology.

A configuration of an image-capturing apparatus according to the present embodiment is described. As illustrated in FIGS. 1 and 2, an image-capturing apparatus 1 according to the present embodiment is a multi-ocular image-capturing apparatus that includes two camera modules 2. The two camera modules 2 are arranged to be supported in a specified positional relationship by a fixing jig portion 3 that serves as a support member.

As described above, the image-capturing apparatus 1 includes a plurality of camera modules 2 (two in the present embodiment) and the fixing jig portion 3 used to support the two camera modules 2 in a specified positional relationship. The image-capturing apparatus 1 is formed as an integrated multi-ocular camera module by fixing the two camera modules 2 to the fixing jig portion 3. In the image-capturing apparatus 1, the two camera modules 2 may be distinguished from each other in the following way: one of the two camera modules 2 is a main module, and the other camera module 2 is a submodule.

The camera module 2 is a so-called monocular camera module that generates an image signal of a subject. The camera module 2 includes, for example, a solid-state imaging device such as a CMOS image sensor, and an optical system such as a lens unit that acts on light received by the solid-state imaging device, and has a specified optical axis with respect to the optical system. The two camera modules have a basic configuration in common. Here, the monocular camera module is a camera module that includes a single solid-state imaging device, and the multi-ocular camera module is a camera module that includes a plurality of solid-state imaging devices obtained by connecting a plurality of monocular camera modules.

The two camera modules 2 are fixed to the fixing jig portion 3 in a state in which the two camera modules 2 are arranged in parallel such that their optical axes are parallel to each other. The two camera modules 2 are connected to be supported in a specified positional relationship by the fixing jig portion 3. As described above, the fixing jig portion 3 serves as a connection member used to connect a plurality of camera modules 2. Specifically, as illustrated in FIG. 2, in a state of being adjacent to each other in a symmetrical positional relationship, the two camera modules 2 are arranged to be supported by the fixing jig portion 3.

[Configuration of Camera Module]

Figure 3:
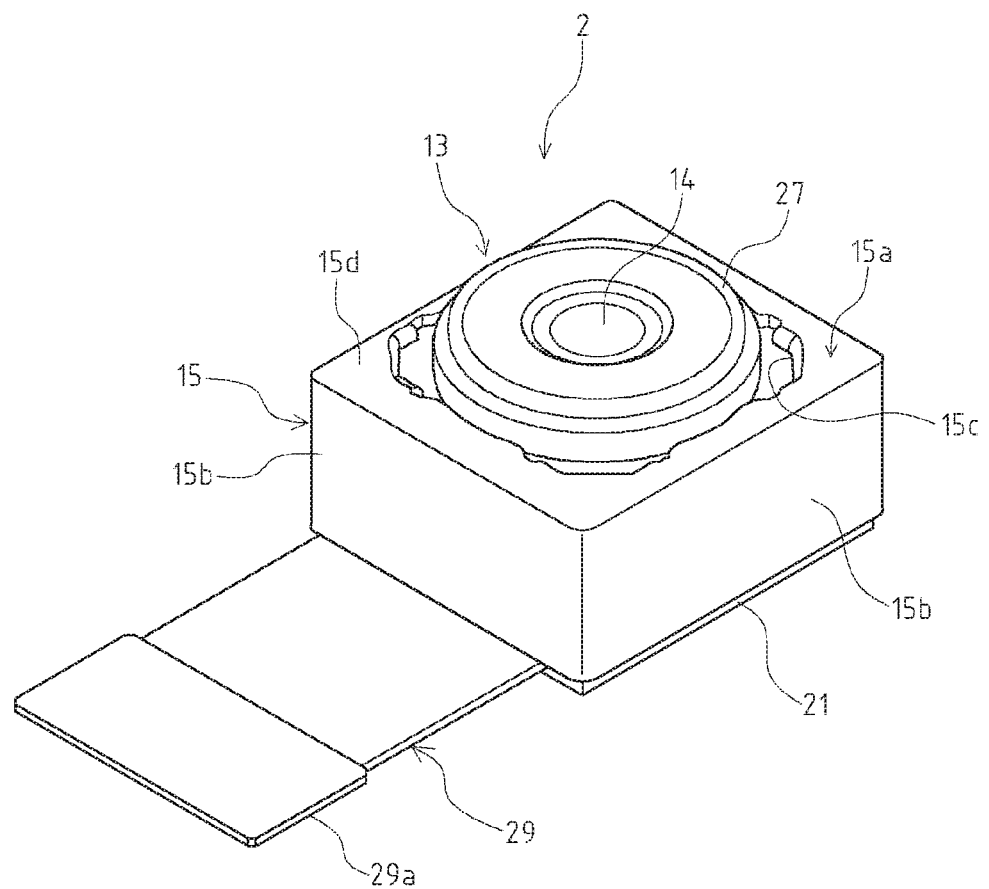
FIG. 3 is a perspective view illustrating an appearance of a camera module according to the embodiments of the present technology.

A configuration example of the camera module 2 according to the present embodiment is described. As illustrated in FIGS. 2 and 3, the camera module 2 includes a sensor package 11 that includes a CMOS image sensor 12 that is a solid-state imaging device that images a subject, a lens unit 13 that is an optical system that includes a plurality of lenses 14, and a housing 15 that accommodates the lens unit 13 and the like.

The image sensor 12 in the camera module 2 includes, for example, a pixel portion that includes a plurality of two-dimensionally arranged pixels, and a peripheral circuit that performs driving of a pixel, an analog-digital (A/D) conversion, and the like. In the image sensor 12, an image of light (image light) entering from the lens 14 included in the lens unit 13 is formed on a light receiving surface of the pixel portion, and the light of the formed image is photoelectrically converted to generate a pixel signal that is an image signal.

The sensor package 11 includes a substrate 21 made of an organic material such as plastic, ceramics, or the like. The image sensor 12 is mounted on the substrate 21. The image sensor 12 is a rectangular-plate-shaped chip, and is die-bonded to the surface of the substrate 21 using an insulating or conductive paste. The image sensor 12 and the substrate 21 in the sensor package 11 are electrically connected to each other using a plurality of bonding wires 22.

A frame portion 23 is provided on the surface of the substrate 21 to surround the substrate 21 and the bonding wire 22. As illustrated in FIG. 2, the frame portion 23 is in the form of a box, and includes a side wall 23a situated to surround the substrate 21 and the bonding wire 22, and a flat-plate-shaped top face portion 23b that faces the substrate 21. An opening 23c is formed in the top face portion 23b of the frame portion 23 above the image sensor 12.

Glass 25 that is a translucent member is provided on the top face portion 23b of the frame portion 23 to close the opening 23c. For example, glass that blocks infrared light is used as the glass 25. The glass 25 is fixed to the frame portion 23 using an adhesive. A hollow portion 26 is formed by the frame portion 23 and the glass 25 to surround the image sensor 12 on the substrate 21. As described above, the sensor package 11 has a hollow package structure.

The lens unit 13 is provided above the glass 25. The lens unit 13 forms an image of light from a subject into the image sensor 12 using a plurality of lenses 14. The lens unit 13 includes a support cylinder 27 having a cylindrical shape, and supports the plurality of lenses 14 in the support cylinder 27. In the present embodiment, the support cylinder 27 supports four lenses 14 in a state of being stacked in an up-down direction (an up-down direction in FIG. 2) through a spacer or the like, such that the direction of an axis of the cylinder is an optical-axis direction. The lens unit 13 is provided such that the optical-axis direction is a direction perpendicular to a plate surface of the image sensor 12 (the up-down direction).

In such a configuration, light collected by a plurality of lenses 14 is transmitted through the glass 25, and enters a light receiving surface of the image sensor 12. Note that the lens unit 13 includes four lenses 14 in the example illustrated in FIG. 2, but the number of lenses included in the lens unit 13 is not limited.

Further, in order to, for example, adjust a focal position, the camera module 2 includes a drive section 28 that is an actuator that drives the lens unit 13. The drive section 28 is provided in the housing 15 above the frame portion 23 to surround the lens unit 13. For example, the drive section 28 includes a movement member movable in a specified direction (the optical-axis direction) by use of a guide portion, a drive motor that is a drive source used to move the movement member, and a connection member that connects the movement member to the support cylinder 27. The drive section 28 moves the lens unit 13 in the optical-axis direction on the basis of autofocusing control or the like that is performed in the image-capturing apparatus 1.

The housing 15 is a housing that covers the camera module 2 from an upper side that is opposite to the side of the substrate 21. In the housing 15, the sensor package 11 and the lens unit 13 are provided in a state of being supported. Here, the lens unit 13 is supported to be movable in an up-down direction through the drive section 28 with respect to the housing 15.

The housing 15 is in the form of a box of which a lower portion is an open side, and includes a horizontally provided top face portion 15a that is a portion having a rectangular flat-plate shape, and four side walls 15b each provided to an edge of the top face portion 15a to form a right angle with the top face portion 15a. For example, the housing 15 is made of metal such as stainless steel or iron. However, the housing 15 may be made of material other than metal, such as resin. The substrate 21 making up the sensor package 11 is situated below the housing 15.

A substantially rectangular opening 15c is formed in a portion of the top face portion 15a of the housing 15 that corresponds to the lens unit 13. The lens unit 13 is arranged in the opening 15c as viewed from a top face of the camera module 2, and is provided to face the opening 15c from the inside of the housing 15. The uppermost lens 14 of the lens unit 13 is upwardly exposed through the opening 15c. For example, the lens unit 13 is movable by the drive section 28 in a state in which the upper portion of the lens unit 13 is caused to protrude from the opening 15c.

Further, in the camera module 2, a signal cable 29 extends from the sensor package 11. An image signal from the image sensor 12 and a control signal for the image sensor 12 are transmitted through the signal cable 29. A connector 29a is provided at a tip of the signal cable 29.

[Configuration of Fixing Jig Portion]

Figure 4:
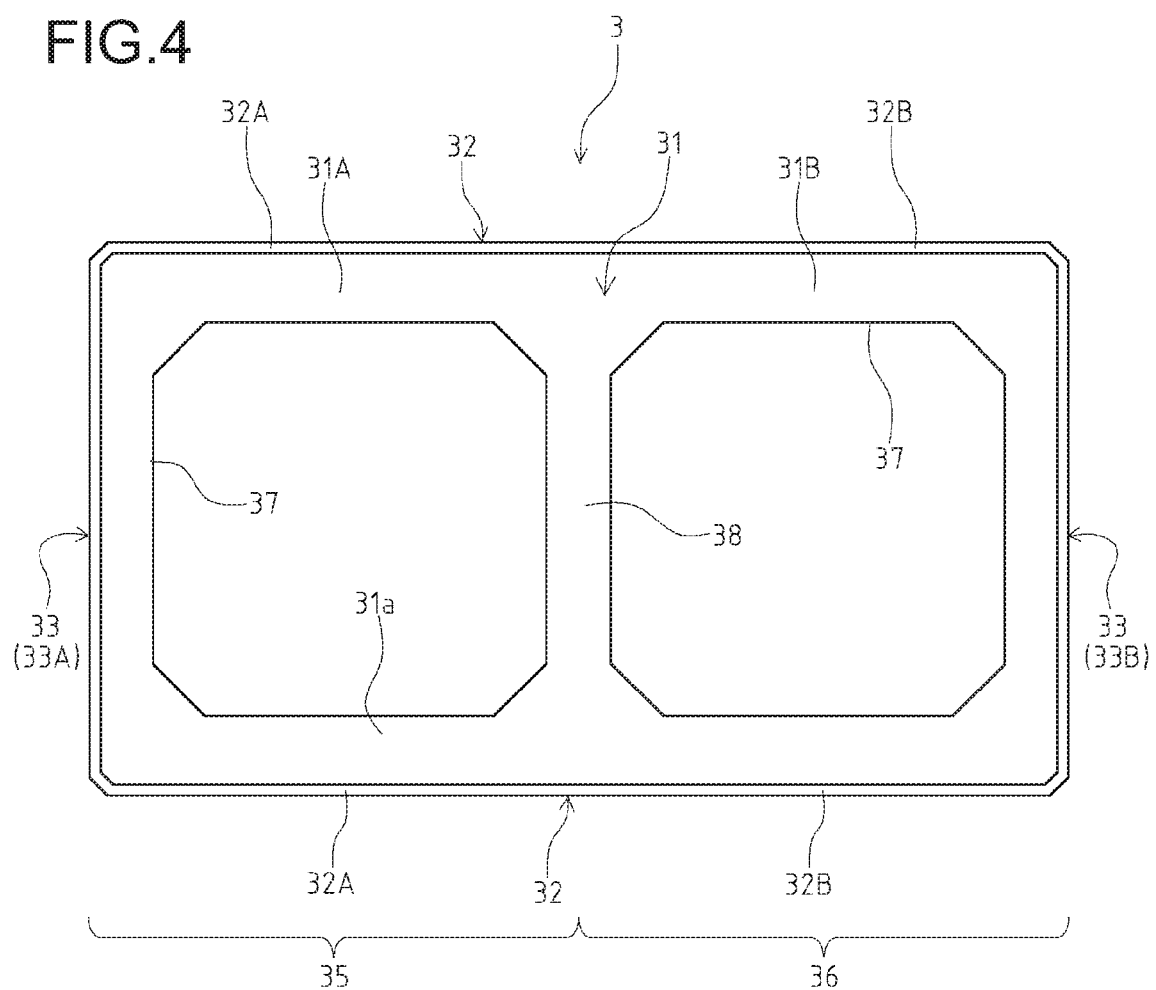
FIG. 4 is a bottom view illustrating a fixing jig portion according to the embodiments of the present technology.

A configuration example of the fixing jig portion 3 according to the present embodiment is described. As illustrated in FIGS. 1 and 4, the fixing jig portion 3 is in the form of a box of which a lower portion is an open side, and includes a horizontally provided top face portion 31 that is a portion having a rectangular flat-plate shape, and four side walls (32, 33) each provided to an edge of the top face portion 31 to be vertical to the top face portion 31. The fixing jig portion 3 is a case member that supports the two camera modules 2 while accommodating a large portion of upper portions of the two camera modules 2. For example, the fixing jig portion 3 is made of metal such as stainless steel or iron. However, the fixing jig portion 3 may be made of material other than metal, such as resin.

In a plan view, the fixing jig portion 3 has a rectangular shape, with a direction in which the two camera modules 2 are adjacent to each other (a left-right direction in FIG. 4) being a longitudinal direction. Thus, the fixing jig portion 3 includes, as four side walls, a pair of longitudinal-side side walls 32 facing in a lateral direction of the fixing jig portion 3 (an up-down direction in FIG. 4), and a pair of lateral-side side walls 33 facing in the longitudinal direction of the fixing jig portion 3 (the left-right direction in FIG. 4). These side walls form a rectangular-frame shape along an outer edge of the top face portion 31 in a bottom view of the fixing jig portion 3. The fixing jig portion 3 has an outer dimension larger than the outer dimension of the two adjacent camera modules 2 in a plan view.

In the fixing jig portion 3, one half in the longitudinal direction of the fixing jig portion 3 (a left portion in FIG. 4) is a first support portion 35 that supports one of the camera modules 2, and the other half in the longitudinal direction of the fixing jig portion 3 (a right portion in FIG. 4) is a second support portion 36 that supports the other camera module 2. The fixing jig portion 3 is formed of the first support portion 35 and the second support portion 36 to be substantially symmetric in the longitudinal direction of the fixing jig portion 3.

Specifically, in the fixing jig portion 3, one half in the longitudinal direction of the top face portion 31 is a first face portion 31A that forms the first support portion 35, and the other half in the longitudinal direction is a second face portion 31B that forms the second support portion 36. Further, in the fixing jig portion 3, one half in the longitudinal direction of each longitudinal-side side wall 32 is a first longitudinal-side side wall 32A that forms the first support portion 35, and the other half in the longitudinal direction is a second longitudinal-side side wall 32B that forms the second support portion 36. Furthermore, in the fixing jig portion 3, one of the two lateral-side side walls 33 that forms the first support portion 35 is a first lateral-side side wall 33A, and another of the two lateral-side side walls 33 that forms the second support portion 36 is a second lateral-side side wall 33B.

A chamfered substantially square opening 37 is formed in each of the first face portion 31A and the second face portion 31B of the top face portion 31. The opening 37 is formed to pass through a large portion of each of the first face portion 31A and the second face portion 31B such that each of the face portions is in the form of a frame in the plan view. Thus, a portion of the top face portion 31 that is situated between the adjacent openings 37 is a spanning portion 38 that extends in the lateral direction of the fixing jig portion 3 in a central portion in the longitudinal direction of the fixing jig portion 3. The opening 37 is formed in a portion that corresponds to the opening 15c of the housing 15 of the camera module 2 fixed to the fixing jig portion 3. The opening 37 has substantially the same opening size as the opening 15c of the housing 15.

The two camera modules 2 in a state of being arranged in parallel such that their respective optical axes are parallel to each other, are fixed to the fixing jig portion 3 having the configuration described above. Each camera module 2 is fixed to the fixing jig portion 3 such that the opening 15c of the housing 15 underlies the opening 37 to overlap the opening 37 and such that the lens unit 13 faces the opening 37 from the inside of the fixing jig portion 3 as viewed from a top face of the image-capturing apparatus 1. The camera module 2 is fixed such that the optical-axis direction of the lens unit 13 is a direction perpendicular to the top face portion 31 of the fixing jig portion 3 (the up-down direction).

Specifically, the camera module 2 is fixed to the fixing jig portion 3 in a state in which an upper surface 15d of the top face portion 15a that is a shoulder for the lens unit 13 protruding from the opening 15c of the housing 15, faces a back surface 31a of the top face portion 31 of the fixing jig portion 3. The camera module 2 is fixed to the fixing jig portion 3 using an adhesive. Thus, an adhesive portion formed by an adhesive being cured exists in a portion including a space between the upper surface 15d of the housing 15 and the back surface 31a of the fixing jig portion 3 between the camera module 2 and the fixing jig portion 3. A structure of fixing the two camera modules 2 to the fixing jig portion 3 is described later.

In a state in which the camera module 2 is fixed to the fixing jig portion 3, the uppermost lens 14 of the lens unit 13 is upwardly exposed through the opening 37. For example, in a state in which the camera module 2 is fixed, the lens unit 13 is movable by the drive section 28 such that the upper portion of the lens unit 13 is caused to protrude from the opening 37.

[Structure of Fixing Camera Module]

An example of a structure of fixing the camera module 2 according to the present embodiment is described. The two camera modules 2 included in the image-capturing apparatus 1 are fixed to the fixing jig portions 3 with different structures from each other. Specifically, the two camera modules 2 are each fixed to the fixing jig portion 3 using an adhesive, but the two camera modules 2 are fixed using respective adhesives having different properties from each other. Hereinafter, the camera module 2 fixed to the first support portion 35 of the fixing jig portion 3 is referred to as a first camera module 2A, and the camera module 2 fixed to the second support portion 36 of the fixing jig portion 3 is referred to as a second camera module 2B, in order to distinguish the two camera modules 2.

The camera module 2 is aligned with respect to the fixing jig portion 3 by using an adhesive to fix the camera module 2 to the fixing jig portion 3, as in the case of the image-capturing apparatus 1 according to the present embodiment. In other words, before an adhesive situated between the fixing jig portion 3 and the camera module 2 is cured, the tilt, the position, and the like of the camera module 2 with respect to the fixing jig portion 3 are adjusted on the basis of an optical axis and the like of the camera module 2.

In the image-capturing apparatus 1 according to the present embodiment, first, the first camera module 2A is fixed to the fixing jig portion 3, and then the second camera module 2B is fixed to the fixing jig portion 3. This will be described later. When the second camera module 2B is fixed, the second camera module 2B is aligned on the basis of an optical axis and the like of the first camera module 2A fixed to the fixing jig portion 3 (an optical-axis adjustment). In the image-capturing apparatus 1, the first camera module 2A that is first attached is a main module, and the second camera module 2B that is subsequently attached is a submodule, on the basis of such order of attachment of the camera module 2.

A general adhesive is used as an adhesive used to fix the first camera module 2A to the fixing jig portion 3 (hereinafter referred to as a "first adhesive"). Specifically, the first adhesive is, for example, a photo-curable adhesive made of, for example, a UV (ultraviolet) curable resin that is an acrylic resin, a thermosetting adhesive made of, for example, an epoxy resin, or a mixture thereof.

It is sufficient if the first camera module 2A is fixed to the fixing jig portion 3 such that a desired degree of accuracy can be achieved. Thus, when the first camera module 2A is fixed to the fixing jig portion 3, a fixing device such as a screw may be used in addition to or instead of an adhesive. Further, the first camera module 2A is bonded to the fixing jig portion 3 in a state in which a gap exists between the first camera module 2A and the fixing jig portion 3. The gap is an interval between the upper surface 15d of the housing 15 of the first camera module 2A and the back surface 31a of the top face portion 31 of the fixing jig portion 3, and is a space in which the first adhesive is situated.

The first adhesive is applied to a space between the first camera module 2A and the first support portion 35 of the fixing jig portion 3, and primarily applied to a space between the top face portion 15a and the first face portion 31A of the top face portion 31. Specifically, between the top face portion 15a and the first face portion 31A, the first adhesive is applied to a portion all around the opening 15c (a portion all around the opening 37) along its opening shape.

Figure 6:
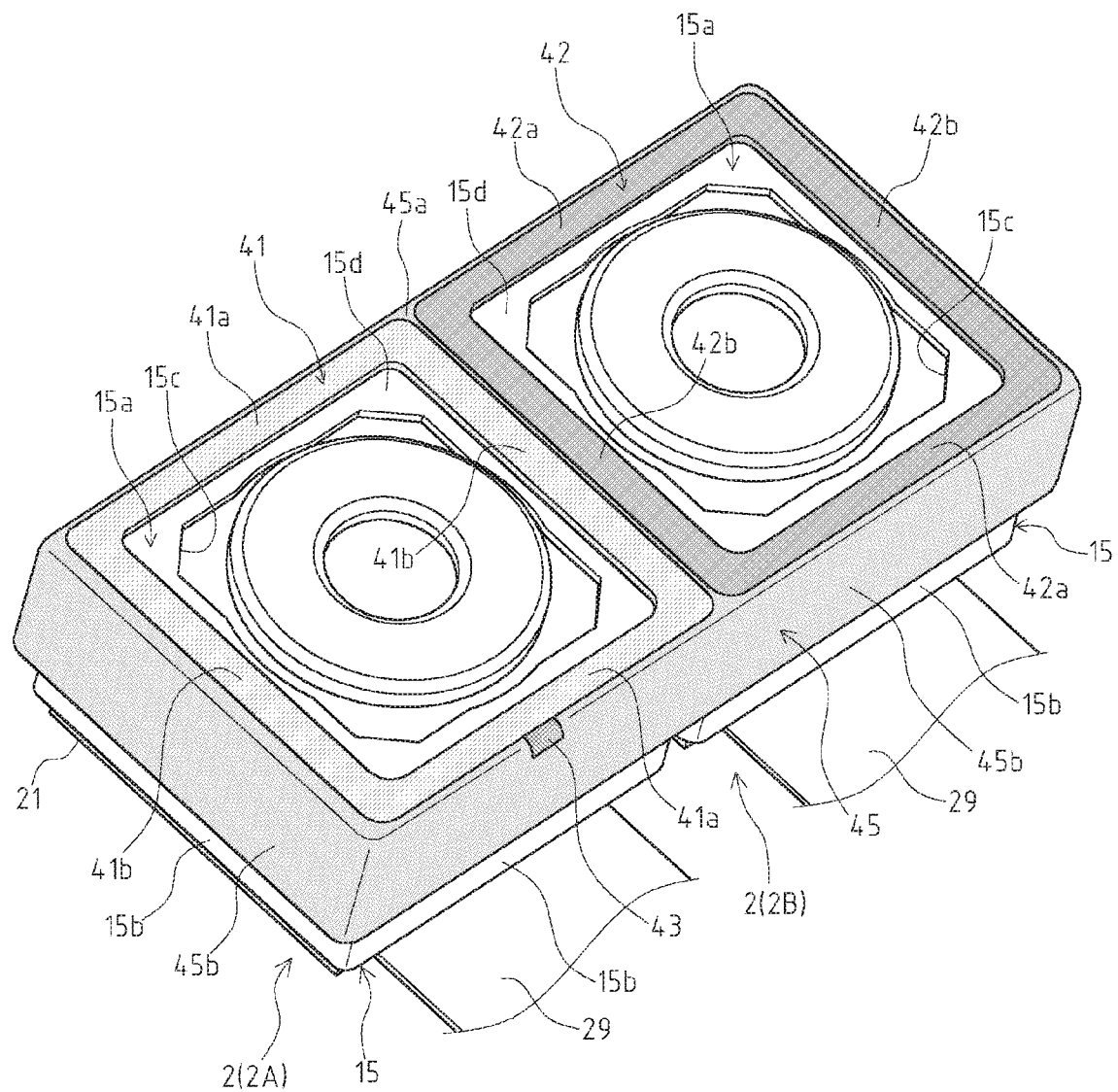
FIG. 6 is a perspective view illustrating an adhesive portion, a reinforcing resin portion, and the camera module of the image-capturing apparatus according to the embodiments of the present technology, the adhesive portion and the reinforcing resin portion being used to fix the camera module.
Figure 7:
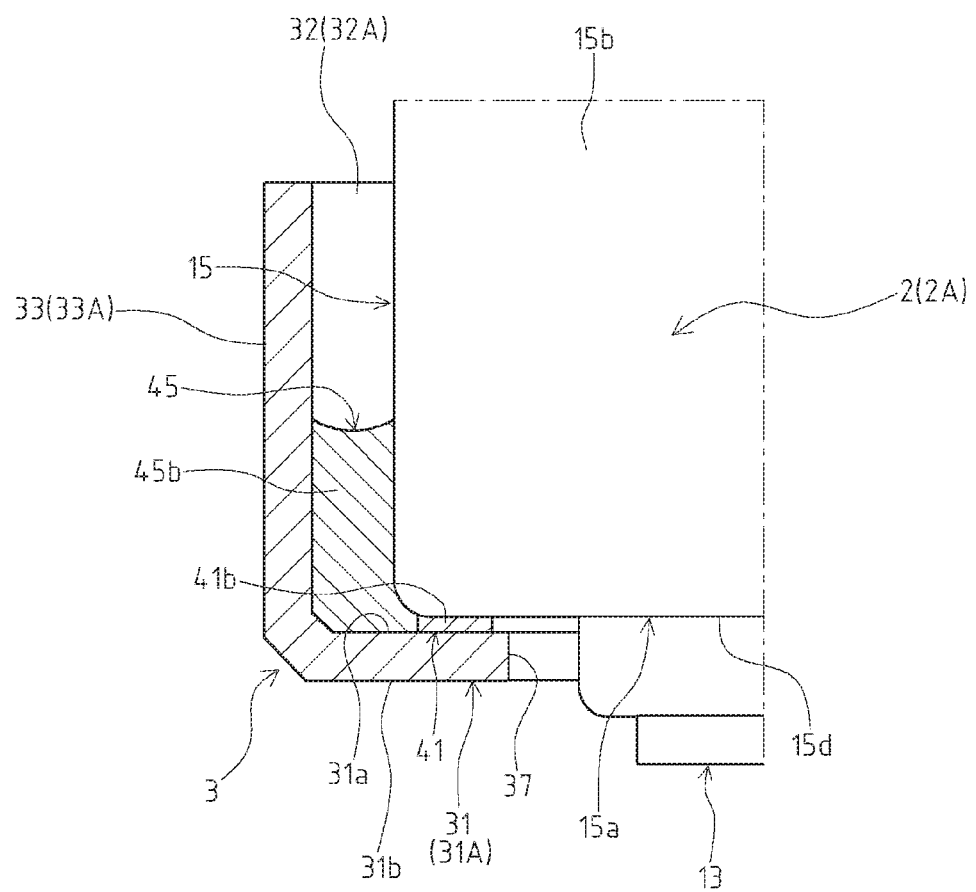
FIG. 7 is an enlarged view of a portion A1 in FIG. 5.

Thus, as illustrated in FIG. 6, a first adhesive portion 41 that is an adhesive portion formed of the first adhesive exists around the opening 15c between the top face portion 15a and the first face portion 31A, such that the first adhesive portion 41 is situated along the opening shape of the substantially rectangular opening 15c. The first adhesive portion 41 has a substantially-rectangular-frame shape that is slightly larger than the opening 15c, and entirely surrounds the opening 15c on the upper surface 15d. Note that FIG. 6 only illustrates each camera module 2, and a resin portion such as an adhesive portion situated between the housing 15 and the fixing jig portion 3 in the image-capturing apparatus 1.

Specifically, the first adhesive portion 41 includes a pair of first side portions 41a facing in the lateral direction of the fixing jig portion 3 (the up-down direction in FIG. 4), and a pair of second side portions 41b facing in the longitudinal direction of the fixing jig portion 3 (the left-right direction in FIG. 4). The side portions form a shape of a substantially rectangular frame. Further, the first adhesive portion 41 has a generally flat shape such that each side portion has a transversely elongated cross-sectional shape.

Further, a silver resin portion 43 obtained by curing an applied silver paste exists between the first support portion 35 of the fixing jig portions 3 and the first camera module 2A (refer to FIG. 6). The silver resin portion 43 is a resin portion that is used for conduction and made of silver paste, and is provided for the purpose of, for example, noise suppression.

An adhesive that has the property of being released in a specific temperature range is used as an adhesive used to fix the second camera module 2B to the fixing jig portion 3 (hereinafter referred to as a "second adhesive"). The second adhesive is obtained by, for example, adding a filler to a resin material that serves as an adhesive.

Specifically, the second adhesive is obtained by, for example, adding a foamable filler to a UV curable resin that is an acrylic resin. It is sufficient if the foamable filler has, for example, the property of being increased in volume (expanding) in a specified temperature range by being heated or the like. For example, the foamable filler is obtained by coating an expanding agent such as foamable resin particles with a specified thermoplastic material.

The second adhesive according to the present embodiment uses a UV curable resin as a base material, and has a UV curable property that is a photo-curable property. However, the second adhesive may have a photo-curable property other than a UV curable property (for example, the property of being cured with infrared light, visible light, a laser, or the like), or may have both photo-curable and thermosetting properties, or may have a thermosetting property. Thus, how to cure the second adhesive is not limited, and for example, a photo-curable adhesive made of, for example, a UV curable resin that is an acrylic resin, a thermosetting adhesive made of, for example, an epoxy resin, or a mixture thereof may be applied as a base material of the second adhesive.

Further, the specific temperature range in which the second adhesive according to the present embodiment is releasable is from 85° C. to 100° C. In other words, the second adhesive provides an interfacially releasable performance under a temperature environment in the range of from 85° C. to 100° C. However, the temperature range in which the second adhesive is releasable is not limited to the range of from 85° C. to 100° C.

Furthermore, the second adhesive according to the present embodiment has the property that the thermal conductivity is decreased at a temperature that is equal to or greater than a specified temperature. Here, the specified temperature is, for example, a lower-limit temperature in a temperature range in which the second adhesive is releasable, and is 85° C. in the example described above. However, the specified temperature at which the thermal conductivity of the second adhesive is decreased is not particularly limited.

The second adhesive is applied in a manner substantially symmetric to the manner of applying the first adhesive in the longitudinal direction of the fixing jig portion 3. The second adhesive is applied to a space between the second camera module 2B and the second support portion 36 of the fixing jig portion 3, and primarily applied to a space between the top face portion 15a and the second face portion 31B of the top face portion 31. Specifically, between the top face portion 15a and the second face portion 31B, the second adhesive is applied to the portion all around the opening 15c (the portion all around the opening 37) along its opening shape.

Thus, as illustrated in FIG. 6, a second adhesive portion 42 that is an adhesive portion formed of the second adhesive exists around the opening 15c between the top face portion 15a and the second face portion 31B, such that the second adhesive portion 42 is situated along the opening shape of the substantially rectangular opening 15c. The second adhesive portion 42 has a substantially-rectangular-frame shape that is slightly larger than the opening 15c, and entirely surrounds the opening 15c on the upper surface 15d.

Specifically, the second adhesive portion 42 includes a pair of first side portions 42a facing in the lateral direction of the fixing jig portion 3, and a pair of second side portions 42b facing in the longitudinal direction of the fixing jig portion 3. The side portions form a shape of a substantially rectangular frame. Further, the second adhesive portion 42 has a generally flat shape such that each side portion has a transversely elongated cross-sectional shape.

Figure 5:
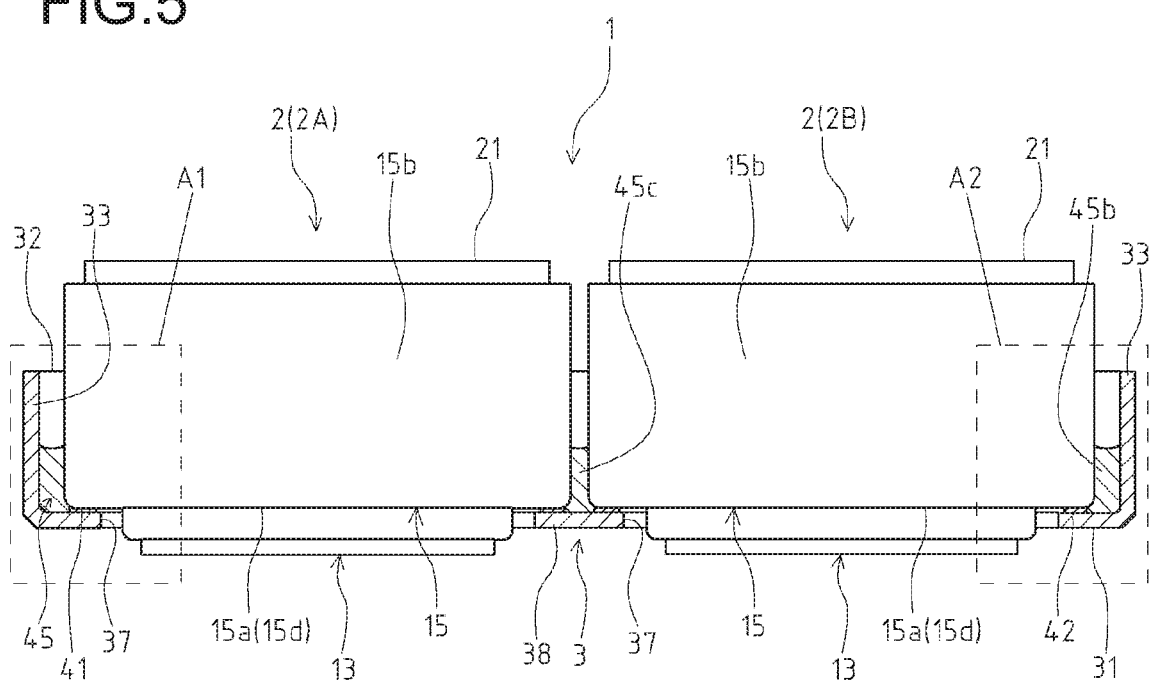
FIG. 5 is a partial cross-sectional view illustrating the configuration of the image-capturing apparatus according to the embodiments of the present technology.

As illustrated in FIGS. 5 and 6, the image-capturing apparatus 1 according to the present embodiment includes a reinforcing resin portion 45 that reinforces an adhesion strength, in order to assist in fixing the camera module 2 to the fixing jig portion 3 using an adhesive. The reinforcing resin portion 45 is made of a reinforcing resin material that is an adhesive, and is formed in a gap between the housing 15 of the camera module 2 and the fixing jig portion 3. The reinforcing resin material of the reinforcing resin portion 45 is, for example, a photo-curable adhesive made of, for example, a UV (ultraviolet) curable resin that is an acrylic resin, a thermosetting adhesive made of, for example, an epoxy resin, or a mixture thereof.

The reinforcing resin portion 45 is formed of a reinforcing resin material filled into a gap between each housing 15 and the fixing jig portion 3, such that the reinforcing resin portion 45 entirely surrounds the two camera modules 2 in the fixing jig portion 3. After the first adhesive portion 41, the silver resin portion 43, and the second adhesive portion 42 are formed, the reinforcing resin material that is the reinforcing resin portion 45 is filled into a gap between the housing 15 of the camera module 2 and the fixing jig portion 3 from the side of an opening of the gap, the gap being situated on the rear side of the fixing jig portion 3. The gap situated between the fixing jig portion 3 and the two camera modules 2 is sealed due to the reinforcing resin portion 45.

Thus, between the top face portion 15a of the housing 15 on which the first adhesive portion 41 and the like are formed, and the top face portion 31 of the fixing jig portion 3, the reinforcing resin portion 45 includes an top face reinforcing portion 45a formed to surround the first adhesive portion 41 and the silver resin portion 43, and to surround the second adhesive portion 42. Further, the reinforcing resin portion 45 includes four lateral-face reinforcing portions 45b that are formed between the longitudinal-side side walls 32 and the lateral-side side walls 33 of the fixing jig portion 3, and the side walls 15b of the housing 15, the side walls 15b respectively facing the longitudinal-side side walls 32 and the lateral-side side walls 33. Furthermore, the reinforcing resin portion 45 includes a partition reinforcing portion 45c that is formed into a partition between the side walls 15b of the housings 15 of the adjacent camera modules 2, the side walls 15b of the housings 15 of the adjacent camera modules 2 facing each other (refer to FIG. 5). The partition reinforcing portion 45c is a portion that connects the housings 15 of the adjacent camera modules 2. However, the shape of the reinforcing resin portion 45 is formed as appropriate, depending on, for example, the shapes of the fixing jig portion 3 and the housing 15 of each camera module 2, the shape of a gap formed therebetween, or the characteristics of a reinforcing resin material.

FIG. 6 illustrates shapes of faces situated on the front sides (the outer sides) of the first adhesive portion 41, the second adhesive portion 42, the silver resin portion 43, and the reinforcing resin portion 45 that are formed of an adhesive in a gap between the fixing jig portion 3 and the two camera modules 2, the shapes of the faces being obtained by transferring a shape of a face situated on the rear side of the fixing jig portion 3. As illustrated in FIG. 6, all of the faces situated on the front sides (the outer sides) of respective resin portions that are the first adhesive portion 41, the second adhesive portion 42, the silver resin portion 43, and the reinforcing resin portion 45 appear outwardly. This shows that each resin portion is in contact with the face situated on the rear side of the fixing jig portion 3.

As described above, the image-capturing apparatus 1 according to the present embodiment includes, as a plurality of camera modules 2, one first camera module 2A fixed to the fixing jig portion 3, and one second camera module 2B fixed to the fixing jig portion 3 using the second adhesive portion 42 formed of the second adhesive having the property of being released in a specific temperature range. The image-capturing apparatus 1 further includes a reinforcing resin portion 45 formed of a resin material filled into a space between the fixing jig portion 3 and the camera module 2, the space being provided with the first adhesive portion 41 and the second adhesive portion 42. Note that the image-capturing apparatus 1 according to the present embodiment includes one second camera module 2B. However, the number of the second camera module 2B is not limited to one, and a plurality of second camera modules 2B may be included.

<2. Method for Producing Multi-ocular Image-Capturing Apparatus>

A method for producing the image-capturing apparatus 1 according to the present embodiment is described using FIGS. 9, 10A, 10B, 10C, 11A, 11B, and 11C. Note that the method for producing the image-capturing apparatus 1 according to the present embodiment relates to a method for fixing, to the fixing jig portions 3, a plurality of camera modules 2 produced in advance.

Figure 9:
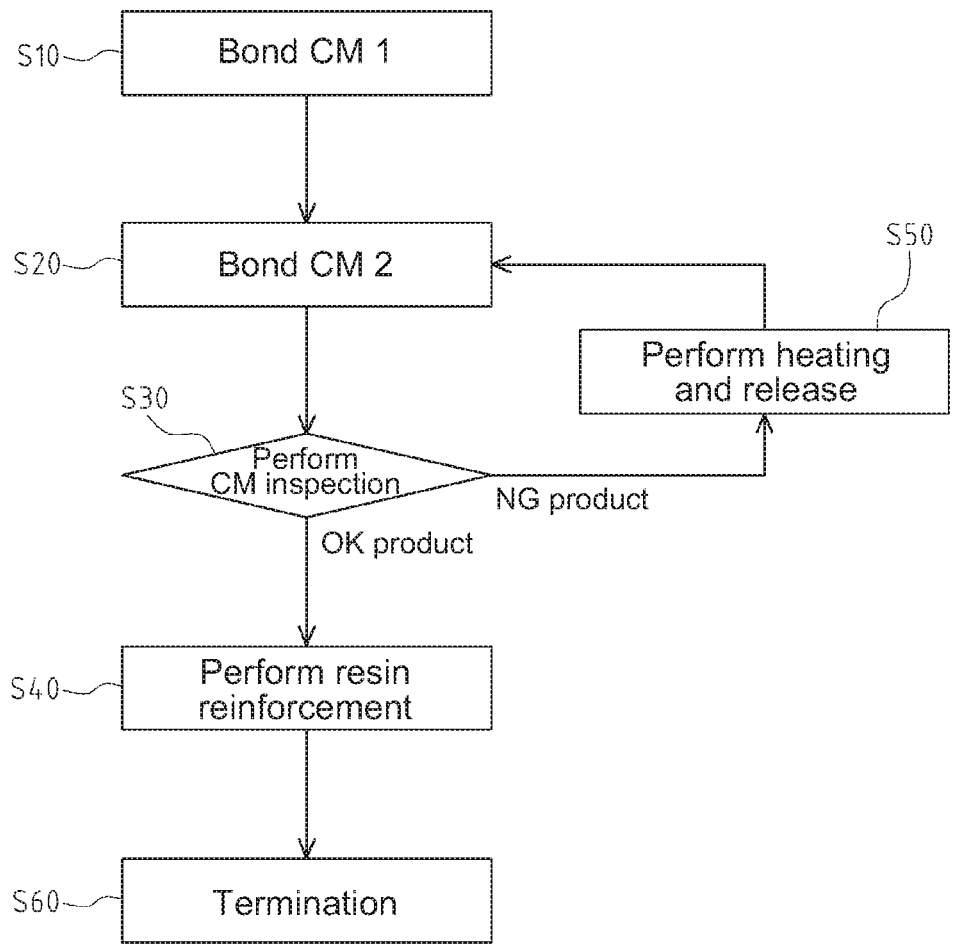
FIG. 9 is a flowchart illustrating an example of a method for producing the image-capturing apparatus according to the embodiments of the present technology.
Figure 10A:
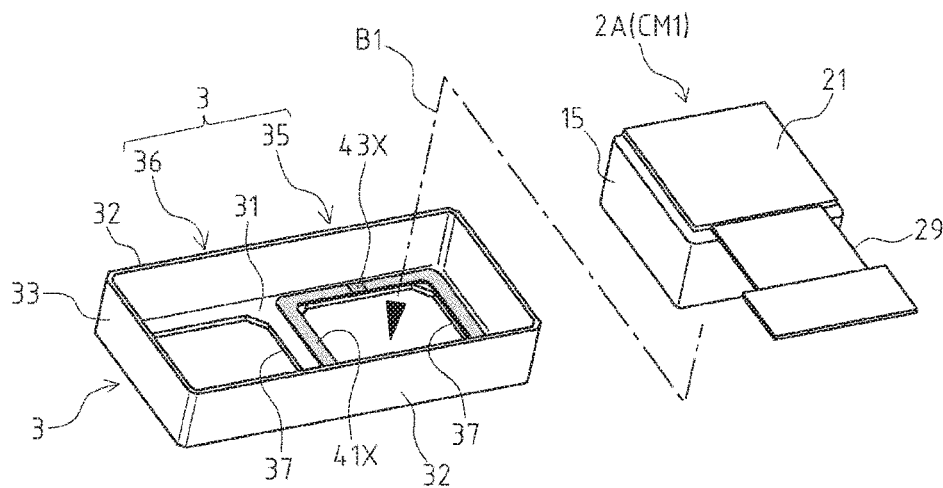
FIGS. 10A, 10B, and 10C is a are diagrams describing a first half of the example of the method for producing the image-capturing apparatus according to the embodiments of the present technology.

In the method for producing the image-capturing apparatus 1, first, a process of bonding the first camera module 2A (hereinafter also referred to as a "CM 1") is performed (S10) as a process of fixing the CM 1 to the fixing jig portion 3, as illustrated in FIG. 9. In other words, as illustrated in FIG. 10A, the CM 1 that is a main module is fixed to be attached to the fixing jig portion 3 using a first adhesive 41X (refer to an arrow B1).

Specifically, first, using a dispenser or the like (not illustrated), the first adhesive 41X forming the first adhesive portion 41, and a silver paste 43X forming the silver resin portion 43 are applied to a specified portion of at least one of the fixing jig portion 3 or the CM 1. Here, the first adhesive 41X is applied to form a shape of the first adhesive portion 41 as described above, and the silver paste 43X is applied to a specified portion for forming the silver resin portion 43.

Then, the CM 1 is assembled to the fixing jig portion 3 such that a portion of the lens unit 13 that protrudes from the opening 15c of the housing 15 faces the opening 37 of the fixing jig portion 3. Here, when a fixing device such as a screw is used to fix the CM 1 to the fixing jig portion 3, fixing work using the fixing device is performed.

Figure 10B:
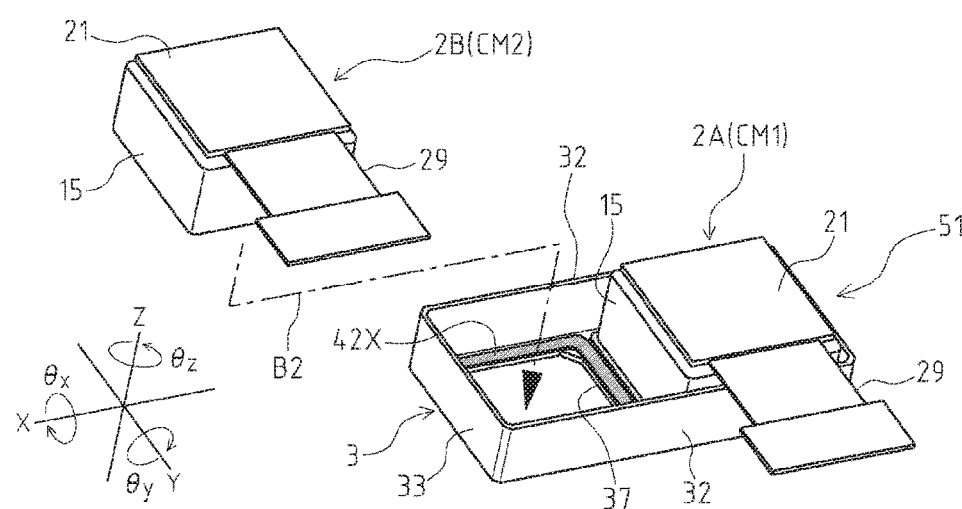

Thereafter, a process of curing the first adhesive 41X and the silver paste 43X is performed. Here, when the first adhesive 41X has a thermosetting property, a heating process of curing the first adhesive 41X (curing) is performed. When the first adhesive 41X has a photo-curable property such as a UV curable property, a process of irradiating light (such as ultraviolet rays) with which the first adhesive 41X is cured, is performed. The same applies to the silver paste 43X. Consequently, the first adhesive 41X and the silver paste 43X are cured to form the first adhesive portion 41 and the silver resin portion 43. This results in a structure 51 (hereinafter referred to as a "sub-assembly") in which the CM 1 is fixed to the fixing jig portion 3, as illustrated in FIG. 10B.

Next, a process of bonding the second camera module 2B (hereinafter also referred to as a "CM 2") is performed (S20) as a process of fixing the CM 2 to the fixing jig portion 3 using the second adhesive, as illustrated in FIG. 9. In other words, as illustrated in FIG. 10B, the CM 2 that is a submodule is fixed to be attached to the fixing jig portion 3 of the sub-assembly 51 using a second adhesive 42X (refer to an arrow B2).

Specifically, first, using a dispenser or the like (not illustrated), the second adhesive 42X forming the second adhesive portion 42 is applied to a specified portion of the face situated on the rear side of the fixing jig portion 3. Here, the second adhesive 42X is applied to form a shape of the second adhesive portion 42 as described above. Note that the second adhesive 42X may be applied to the housing 15 of the CM 2. Then, as in the case of the CM 1, the CM 2 is assembled to the fixing jig portion 3 such that a portion of the lens unit 13 that protrudes from the opening 15c of the housing 15 faces the opening 37 of the fixing jig portion 3.

When the CM 2 is bonded to the fixing jig portion 3, alignment (an optical-axis adjustment) of the CM 2 is performed. In other words, before the second adhesive 42X situated between the fixing jig portion 3 and the CM 2 is cured, the tilt, the position, and the like of the CM 2 with respect to the fixing jig portion 3 are adjusted using, as a reference, an optical axis of the CM 1 fixed to the fixing jig portion 3 earlier, in order to adjust the image-capturing range. The alignment of the CM 2 is performed such that an optical axis of the CM 2 is parallel to the optical axis of the CM 1 and is situated at a specified position relative to the CM 1. Note that, instead of the optical axis of the CM 1, a specified portion (such as a face of the top face portion 31) of the fixing jig portion 3 may be used as the reference used for the alignment of the CM 2.

Figure 8:
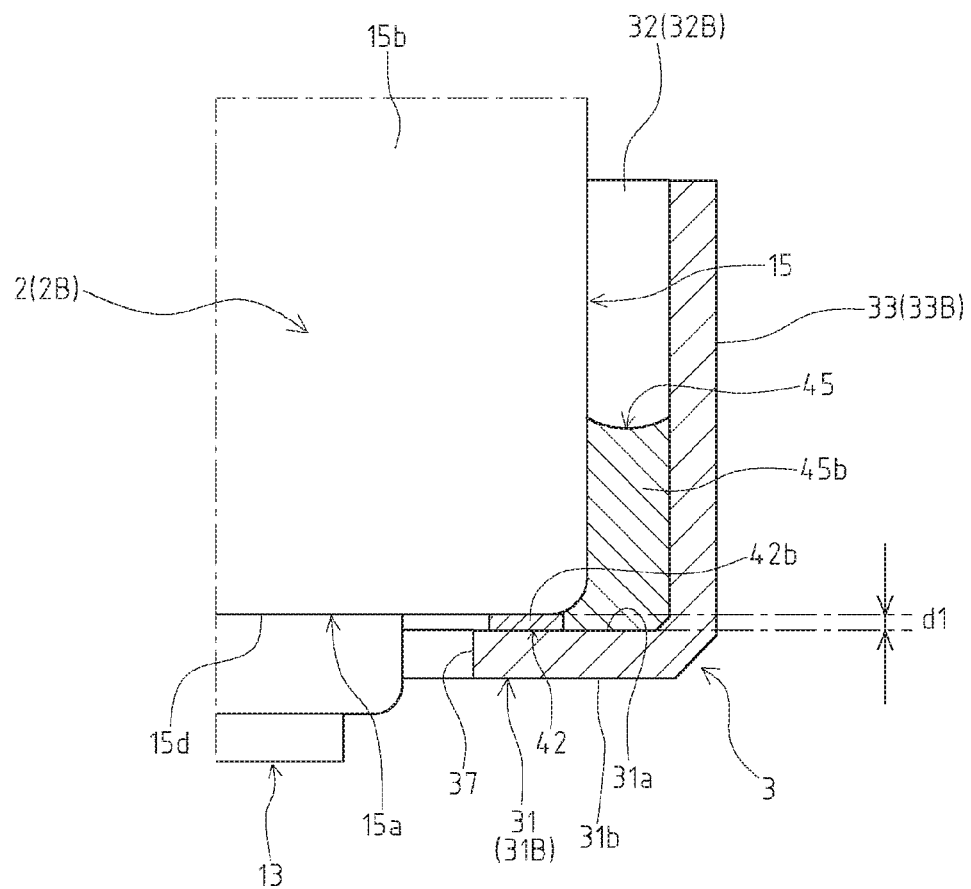
FIG. 8 is an enlarged view of a portion A2 in FIG. 5.

Further, when the alignment of the CM 2 is performed, a gap d1 is provided between the CM 2 and the fixing jig portion 3 in advance such that the CM 2 does not interfere with the fixing jig portion 3 when the tilt and the position of the CM 2 are adjusted (refer to FIG. 8). The gap d1 is an interval between the upper surface 15d of the housing 15 of the CM 2 and the back surface 31a of the top face portion 31 of the fixing jig portion 3, and is a space filled with the second adhesive 42X. In other words, in a state in which the CM 2 is held by the second support portion 36 of the fixing jig portion 3 through the second adhesive 42X, the gap d1 ensures a movement margin for adjusting the tilt and the position of the CM 2. The dimension of the gap d1 is, for example, from a few micrometers to a few hundred micrometers. Further, regarding the alignment of the CM 2, a six-axis adjustment is performed that includes positional adjustments in directions of an X-axis, a Y-axis, and a Z-axis, and adjustments of angles θx, θy, and θz. The X-axis, the Y-axis, and the Z-axis are axes for a three-dimensional orthogonal coordinate. The angles θx, θy, and θz are angles respectively formed by rotations about the X-axis, the Y-axis, and the Z-axis.

After the alignment of the CM 2 is performed, a process of curing the second adhesive 42X is performed. Since the second adhesive 42X according to the present embodiment has a UV curable property, a process of irradiating ultraviolet rays with which the second adhesive 42X is cured, is performed.

Figure 10C:
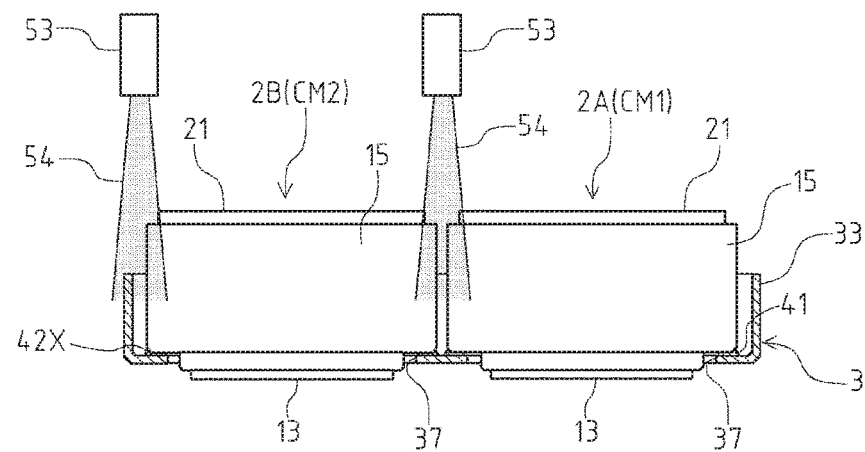

Specifically, as illustrated in FIG. 10C, under a specified pressure environment, ultraviolet (UV) rays 54 are irradiated by a specified ultraviolet-ray-irradiation apparatus 53 onto the gap between the housing 15 of the CM 2 and the fixing jig portion 3 from the side of an opening situated on the rear side (an upper portion in FIG. 10C) of the fixing jig portion 3, the specified ultraviolet-ray-irradiation apparatus 53 including a light source used to irradiate ultraviolet rays. The ultraviolet rays 54 act on the second adhesive 42X from the gap between the housing 15 of the CM 2 and the fixing jig portion 3 to cure the second adhesive 42X. Accordingly, the second adhesive portion 42 is formed, and this results in a multi-ocular module 52 having a configuration in which the CM 1 and the CM 2 are fixed to the fixing jig portion 3, as illustrated in A of FIG. 11A. Here, the second adhesive portion 42 is formed as an adhesive portion having a substantially constant thickness of substantially the same dimension as the gap d1.

Next, as illustrated in FIG. 9, a process of performing an inspection for quality (hereinafter referred to as a "CM inspection") with respect to the multi-ocular module 52 in which the CM 1 and the CM 2 are fixed to the fixing jig portion 3, the quality including a state of attachment of the CM 2 to the fixing jig portion 3 (S30). It is determined, in the CM inspection, whether the multi-ocular module 52 is a non-defective product (an OK product) or a defective product (an NG product).

Specifically, regarding the state of attachment of the CM 2 to the fixing jig portion 3, it is determined, in the CM-inspection, whether alignment of the CM 2 is properly performed with respect to a reference. When the alignment of the CM 2 is inadequate, the multi-ocular module 52 is determined to be an NG product. Further, inspection for whether foreign matter such as dust has entered in the process of production is performed in the CM inspection. For example, when dust is reflected in an image-capturing range of the image-capturing apparatus 1, the multi-ocular module 52 is determined to be an NG product.

As illustrated in FIG. 9, when the inspection of the multi-ocular module 52 has been determined to be "OK" in the CM inspection in Step S30, that is, when the multi-ocular module 52 of an inspection target has been determined to be a non-defective product, a process of forming the reinforcing resin portion 45 by filling a resin material (a reinforcing resin material) into a space between the fixing jig portion 3 and the CM 1 and a space between the fixing jig portion 3 and the CM 2, is performed (S40). In other words, this process is a resin-reinforcement process of molding the reinforcing resin portion 45 by filling a reinforcing resin material into the fixing jig portion 3.

Using a dispenser or the like, the reinforcing resin material that forms the reinforcing resin portion 45 is filled into the space between the two camera modules 2 and the fixing jig portion 3 from the side of an opening situated on the rear side of the fixing jig portion 3, in which the first adhesive portion 41, the second adhesive portion 42, and the silver resin portion 43 exist in the space. In order to seal the space between the two camera modules 2 and the fixing jig portion 3, the reinforcing resin material is filled into the space to entirely surround the two camera modules 2 in the fixing jig portion 3, or is partially filled into the space.

Thereafter, a process of curing the reinforcing resin material is performed. Here, when the reinforcing resin material has a thermosetting property, a heating process of curing the reinforcing resin material (curing) is performed. When the reinforcing resin material has a photo-curable property such as a UV curable property, a process of irradiating light (such as ultraviolet rays) with which the reinforcing resin material is cured, is performed. Consequently, the reinforcing resin material is cured to form the reinforcing resin portion 45, and the method for producing the image-capturing apparatus 1 according to the present embodiment is terminated (S60).

On the other hand, as illustrated in FIG. 9, when the inspection of the multi-ocular module 52 has been determined to be "NG" in the CM inspection in Step S30, that is, when the multi-ocular module 52 of an inspection target has been determined to be a defective product, a process of removing the CM 2 from the fixing jig portion 3 by heating the second adhesive portion 42 at a temperature in a specific temperature range and by releasing the second adhesive portion 42 (hereinafter referred to as a "process of removing the CM 2") is performed (S50). In other words, a heating-and-release process of removing the CM 2 from the fixing jig portion 3 by heating the second adhesive portion 42 and by releasing the second adhesive portion 42 from at least one of the fixing jig portion 3 or the CM 2, is performed.

Figure 11A:
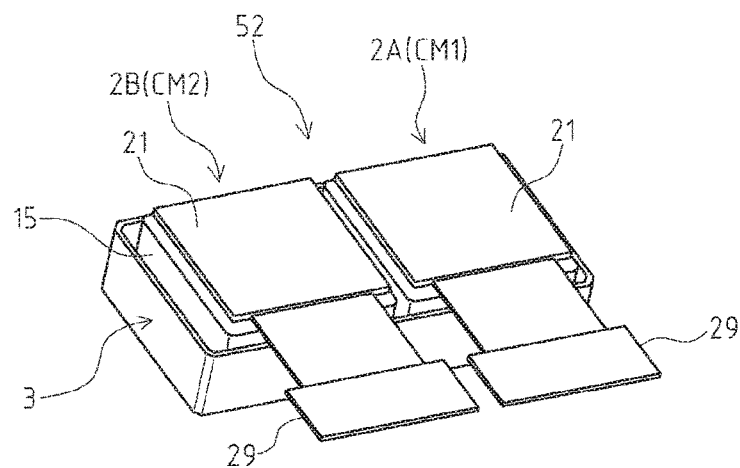
FIGS. 11A, 11B, and 11C are diagrams describing a latter half of the example of the method for producing the image-capturing apparatus according to the embodiments of the present technology.
Figure 11B:
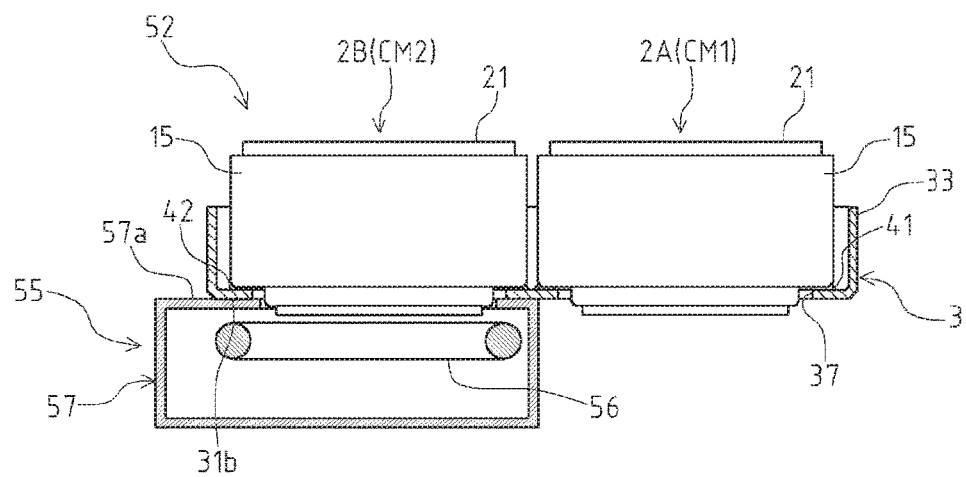

Specifically, in the process of removing the CM 2, the fixing jig portion 3 is heated from outside under a specified pressure environment, using a specified heating apparatus 55 that includes a heat source 56 used to perform heating, such as a heating coil, as illustrated in FIG. 11B. The second adhesive portion 42 is heated through the fixing jig portion 3 to a temperature in the range of from 85° C. to 100° C. (for example, about 90° C.). The heating apparatus 55 accommodates the heat source 56 in a casing 57 made of metal such as stainless steel or iron.

The heating apparatus 55 includes, in the casing 57, a contact support surface 57a in contact with the fixing jig portion 3 that supports the multi-ocular module 52. The contact support surface 57a is brought into contact with a front surface 31b of the second face portion 31B in the second support portion 36 of the fixing jig portion 3, in which the CM 2 is fixed to the second support portion 36. In other words, the contact support surface 57a is partially brought into contact with the top face portion 31 of the fixing jig portion 3 on the side of the front surface 31b, and the heating apparatus 55 locally heats a portion, in the fixing jig portion 3, in which the second adhesive portion 42 is situated on the side of the back surface 31a. The multi-ocular module 52 is supported on the casing 57 in a specified pose, using a suitable method such as air suction.

According to the heating apparatus 55, heat generated by the heat source 56 acts on the second adhesive portion 42 through the casing 57 by heat conduction. This results in heating the second adhesive portion 42 to a temperature (for example, about 90° C.) in a specific temperature range in which the second adhesive portion 42 is releasable.

In the process of heating the second adhesive portion 42, the temperature reached by the CM 2 is controlled to be equal to or less than a specified temperature, since, as described above, the second adhesive portion 42 has a thickness of substantially the same dimension as the gap d1 between the CM 2 and the fixing jig portion 3 (refer to FIG. 8), and the second adhesive portion 42 (the second adhesive 42X) has the property that the thermal conductivity is decreased at a temperature that is equal to or greater than a specified temperature (for example, 85° C.)

Figure 11C:
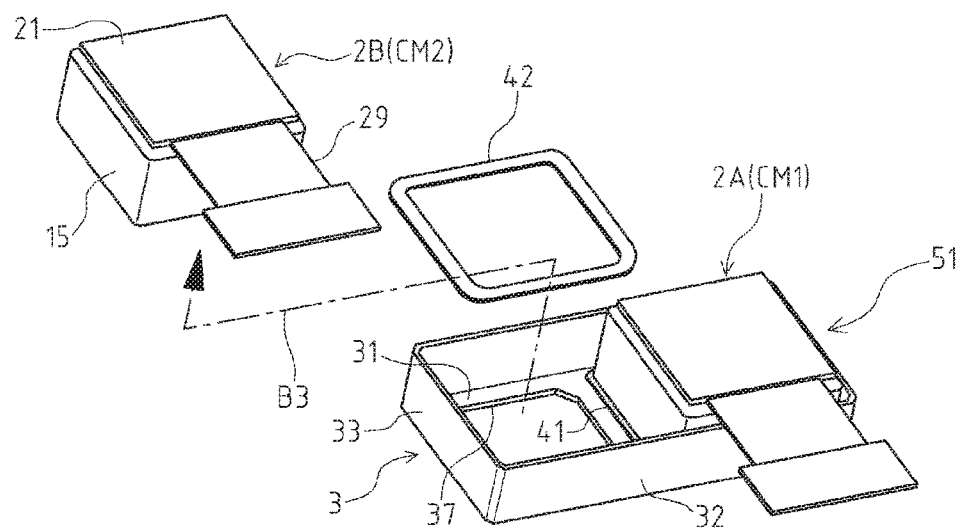

When the second adhesive portion 42 has become releasable, it is possible to remove the CM 2 from the fixing jig portion 3. In such a state, the CM 2 is removed from the fixing jig portion 3, as illustrated in FIG. 11C (refer to an arrow B3). It is possible to release the releasable second adhesive portion 42 from the fixing jig portion 3 and from the housing 15 of the CM 2, while maintaining the rectangular-frame shape of the second adhesive portion 42.

In the process of removing the CM 2, a configuration of an apparatus used to heat the second adhesive portion 42 and a method for heating the second adhesive portion 42 are not particularly limited. For example, the use of a laser or the like makes it possible to heat the second adhesive portion 42 without coming into contact with the fixing jig portion 3. Further, in the present embodiment, an adhesive that does not have the property of being released at a specific temperature is used as the first adhesive 41X used to fix the CM 1 to the fixing jig portion 3, which is different from the case of the second adhesive 42X.

After the process of removing the CM 2 is performed, a process of fixing the CM 2 to the fixing jig portion 3 again is performed (S20). In other words, a process of bonding and fixing the CM 2 to the fixing jig portion 3 of the sub-assembly 51 using the second adhesive 42X, as described above, is newly performed. Here, when a result of the CM inspection in Step S30 is a failure in the CM 2 itself, this CM 2 is discarded, and a separately prepared CM 2 is fixed to the fixing jig portion 3 of the sub-assembly 51. Then, after the CM 2 is fixed in Step S20, a CM inspection is performed as described above (S30), and a process depending on a result of the inspection is performed.

The image-capturing apparatus 1 and the method for producing the image-capturing apparatus 1 according to the present embodiment as described above make it possible to suppress a reduction in yield and to reduce production costs even when a failure has occurred with respect to the alignment and the like of the camera module 2 in a multi-ocular configuration in which a plurality of camera modules 2 is included.

For example, it is assumed that the CM 2 is fixed to the fixing jig portion 3 using an ordinary adhesive in the process of producing the image-capturing apparatus 1 described above. When a failure has occurred in a state of the multi-ocular module 52 in the CM inspection, there is a need to take care of the entirety of the multi-ocular module 52 as a defective product even if the camera module 2 itself is a non-defective product. This is not favorable in terms of yield.

Thus, according to the image-capturing apparatus 1 and the method for the image-capturing apparatus 1 according to the present embodiment, the process of the CM inspection (S30) is performed immediately after the process of fixing the CM 2 to the fixing jig portion 3 (S20). Then, for example, when it has been determined, in the CM inspection (S30), that the alignment of the CM 2 with respect to a reference is inadequate, the process of removing the CM 2 (S50) is performed to remove the CM 2 from the fixing jig portion. This results in being able to mount the CM 2 again by performing the process of fixing the CM 2 to the fixing jig portion 3 (S20).

Further, for example, when dust has entered one of the camera modules 2 in the process of production, and is reflected in an image-capturing range, it is possible to only take care of the camera module 2 in which dust is reflected as a defective product. In this case, when the CM 2 has been determined to be a defective product, it is possible to mount the CM 2 again after the process of removing the CM 2 is performed (S50). On the other hand, when the CM 1 has been determined to be a defective product, the CM 2 is removed by performing the process of removing the CM 2 (S50), and the sub-assembly 51 is produced again by performing the process of fixing the CM 1 to the fixing jig portion 3 (S10). Then, it is possible to mount the removed CM 2 again on the fixing jig portion 3 of the sub-assembly 51.

As described above, since it is possible to mount the CM 2 again, it is possible to save, as a non-defective product, the camera module 2, which would have been taken care of as a defective product in the past. This results in improving yield. In other words, the image-capturing apparatus 1 and the method for producing the image-capturing apparatus 1 according to the present embodiment make it possible to easily repair the multi-ocular module 52, and this results in there being no need to take care of the camera module 2 itself with which there is no problem as a defective product. This results in improving yield. Consequently, with respect to a multi-ocular image-capturing apparatus that requires a highly accurate alignment with respect to a specified reference when a plurality of camera modules 2 is fixed, it is possible to suppress an increase in costs per apparatus due to an apparatus of a multi-ocular type being produced.

Further, in the image-capturing apparatus 1 according to the present embodiment, the specific temperature range in which the second adhesive used to fix the CM 2 is releasable is a temperature range of from 85° C. to 100° C. Such a temperature range is adopted as a specific temperature range for the second adhesive, on the basis of the following point of view.

With respect to the image-capturing apparatus 1, a reliability test is performed to ensure the quality of the image-capturing apparatus 1. A test related to a temperature environment is generally performed as the reliability test. For example, a temperature test under a specified high-temperature environment in which the temperature is higher than the ordinary temperature, is performed as such a test. When the temperature at which the second adhesive is releasable is lower than 85° C., there is a possibility that the second adhesive will be releasable in the temperature test that is a reliability test. When the second adhesive is releasable in the reliability test, a failure such as a positional shift of the CM 2 with respect to the fixing jig portion 3 may occur.

On the other hand, when the second adhesive reaches a temperature higher than 100° C., the temperatures of the respective components such as the housing 15, the lens 14, and the drive section 28 that are included in the CM 2 and situated around the second adhesive exceed the heat-resistant temperature, and the respective components may lose their characteristics by being affected by heat. In other words, when the temperature of the second adhesive is higher than 100° C., the temperature of the CM 2 may exceed the heat-resistant temperature. From the point of view described above, the temperature range of from 85° C. to 100° C. is adopted as the specific temperature range in which the second adhesive is releasable.

<3. Configuration Example of Each Component of Multi-Ocular Image-Capturing Apparatus>

A favorable configuration example of each component included in the image-capturing apparatus 1 according to the present embodiment is described below.

[Configuration of Corner Portion of Fixing Jig Portion]

In the image-capturing apparatus 1 according to the present embodiment, the second adhesive 42X having a UV curable property is used to fix the CM 2 to the fixing jig portion 3. Thus, when ultraviolet rays are irradiated from the rear side of the fixing jig portion 3 to cure the second adhesive 42X, there is a possibility that the ultraviolet rays will not sufficiently reach a deep portion (a shadowed portion) between the upper surface 15d of the housing 15 and the top face portion 31 of the fixing jig portion 3, and that this will result in proceeding with the production process in a state in which the second adhesive 42X situated in this portion is not sufficiently cured.

When the second adhesive 42X is not sufficiently cured, the second adhesive portion 42 is not successfully released and a residue is likely to be caused in the process of removing the CM 2 described above. This may result in being unable to achieve a good releasable property for the second adhesive portion 42. Thus, in order to sufficiently cure the entirety of the second adhesive 42X, the image-capturing apparatus 1 according to the present embodiment has a configuration indicated below.

Figure 12:
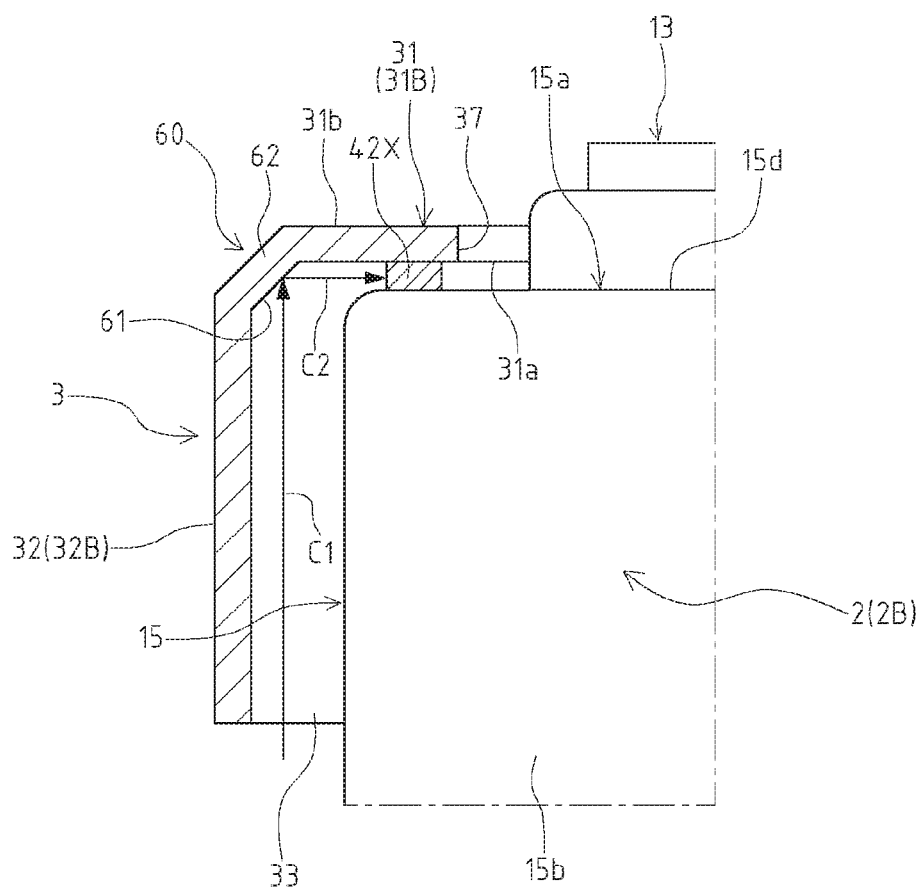
FIG. 12 illustrates a configuration of a corner portion of the fixing jig portion according to the embodiments of the present technology.

As illustrated in FIG. 12, in at least the second support portion 36 that is a portion to which the second camera module 2B is fixed, the fixing jig portion 3 according to the present embodiment includes a light guiding surface 61 in a corner portion 60 in its upper portion, the light guiding surface 61 being used to guide ultraviolet rays to a space between the top face portion 31 and the second camera module 2B, the ultraviolet rays being used to cure the second adhesive 42X. The corner portion 60 is a corner portion formed by the top face portion 31 and each of the longitudinal-side side wall 32 and the lateral-side side wall 33, the top face portion 31 being a first face portion, each of the side walls being a second face portion, in which the second adhesive 42X is situated between the top face portion 31 and the second camera module 2B. In other words, the longitudinal-side side wall 32 and the lateral-side side wall 33 each form the corner portion 60 with the top face portion 31 in the fixing jig portion 3.

Specifically, as illustrated in FIG. 12, the corner portion 60 in the upper portion of the fixing jig portion 3 is a chamfered corner portion of which a surface is formed into a C-shape. In other words, the corner portion 60 includes an inclined slope portion 62 between the horizontal top face portion 31 and each of the longitudinal-side side wall 32 and the lateral-side side wall 33 each being vertical to the top face portion 31. An inner surface of the slope portion 62 is the light guiding surface 61. For example, the light guiding surface 61 is inclined at an angle of about 45 degrees with respect to a plate surface of the top face portion 31. The light guiding surface 61 is an inclined surface that is oriented inward in the fixing jig portion 3 in the horizontal direction, and is oriented downward in the up-down direction. Note that, although FIG. 12 illustrates, as the corner portion 60 of the fixing jig portion 3, the corner portion 60 formed by the top face portion 31 and the longitudinal-side side wall 32, the slope portion 62 is similarly formed in the corner portion 60 formed by the top face portion 31 and the lateral-side side wall 33.

It is possible to provide the following action on ultraviolet rays in the process of irradiating ultraviolet rays to cure the second adhesive 42X, by providing the light guiding surface 61 to the corner portion 60 of the fixing jig portion 3, as described above. In other words, as illustrated in FIG. 12, ultraviolet rays entering the gap between the housing 15 of the CM 2 and the fixing jig portion 3 from the rear side of the fixing jig portion 3 (refer to an arrow C1), is reflected off the light guiding surface 61 to be refracted at about 90 degrees. Consequently, the ultraviolet rays enter the second adhesive 42X situated inward in the horizontal direction (on an optical-axis side of the CM 2) with respect to the corner portion 60 (refer to an arrow C2).

The above-described configuration in which the light guiding surface 61 is provided to the corner portion 60 of the fixing jig portion 3 enables ultraviolet rays to penetrate into the deep portion in the fixing jig portion 3 with certainty due to the rays being refracted using the light guiding surface 61, and enables the ultraviolet rays to be efficiently absorbed into the second adhesive 42X. This makes it possible to sufficiently cure the entirety of the second adhesive 42X, and to overcome insufficient curing of the second adhesive 42X.

In other words, with respect to a portion of the second adhesive 42X that is situated in the shadowed portion in the fixing jig portion 3, it is possible to obtain a rate of curing reaction equivalent to that of a direct-light-entrance portion of the second adhesive 42X that ultraviolet rays directly enter. Here, the direct-light-entrance portion of the second adhesive 42X is a portion that is exposed in the gap between the fixing jig portion 3 and the housing 15 as viewed from the rear side of the fixing jig portion 3. It is possible to obtain a favorable releasable property for the second adhesive portion 42 since it is possible to sufficiently cure the second adhesive 42X as described above.

Further, it is favorable that mirror finishing be performed on the light guiding surface 61 serving as a surface off which ultraviolet rays are reflected. In other words, it is favorable that the light guiding surface 61 be a surface on which mirror finishing has been performed. Such a configuration makes it possible to improve the reflectivity of ultraviolet rays on the light guiding surface 61, and enables ultraviolet rays to efficiently enter the second adhesive 42X situated in the shadowed portion in the fixing jig portion 3. This results in being able to accelerate the curing reaction of the entirety of the second adhesive 42X.

Furthermore, the light guiding surface 61 serving as a surface off which ultraviolet rays are reflected may be a surface on which surface-roughening processing has been performed. For example, well-known processing such as shot blasting or etching is used as the surface-roughening processing. Fine asperities are formed on the light guiding surface 61 by the surface-roughening processing. Such a configuration enables ultraviolet rays entering the light guiding surface 61 to be diffusely reflected. This makes it possible to cause ultraviolet rays to enter the second adhesive 42X uniformly, and thus to accelerate the curing reaction of the entirety of the second adhesive 42X.

Figure 13:
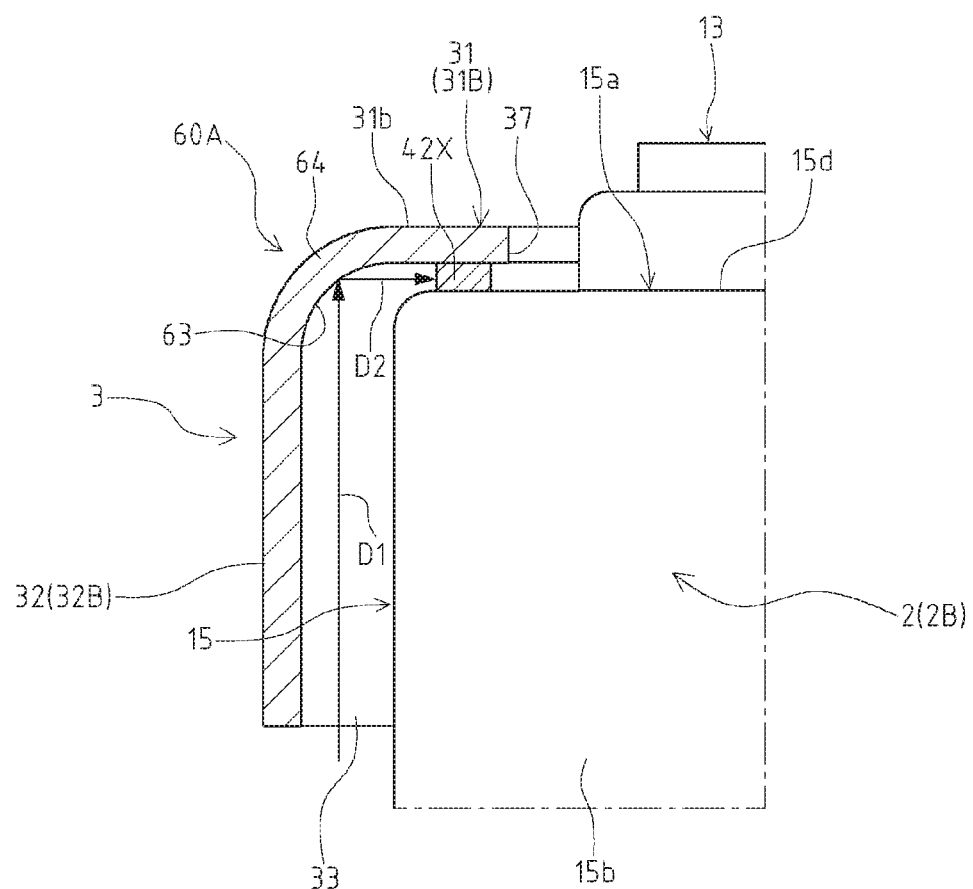
FIG. 13 illustrates a modification of the configuration of the corner portion of the fixing jig portion according to the embodiments of the present technology.

Moreover, as illustrated in FIG. 13, a corner portion 60A in an upper portion of the fixing jig portion 3 may be formed into an R-shape having an increased radius of curvature to form a curved light guiding surface 63. In such a configuration, the corner portion 60A includes a curved portion 64 between the horizontal top face portion 31 and each of the longitudinal-side side wall 32 and the lateral-side side wall 33 each being vertical to the top face portion 31, the curved portion 64 having a shape of a substantially quarter cylinder. An inner surface of the curved portion 64 is the light guiding surface 63. The light guiding surface 63 is a curved surface that is oriented inward in the fixing jig portion 3 in the horizontal direction, and is oriented downward in the up-down direction. Note that, although FIG. 13 illustrates, as the corner portion 60A of the fixing jig portion 3, a corner portion formed by the top face portion 31 and the longitudinal-side side wall 32, the curved portion 64 is similarly formed in a corner portion formed by the top face portion 31 and the lateral-side side wall 33.

It is also possible to provide the following action by providing the light guiding surface 63 to the corner portion 60A of the fixing jig portion 3, as described above. In other words, as illustrated in FIG. 13, ultraviolet rays entering the gap between the housing 15 of the CM 2 and the fixing jig portion 3 from the rear side of the fixing jig portion 3 (refer to an arrow D1), is reflected off the light guiding surface 63 to be refracted at about 90 degrees. Then, the ultraviolet rays enter the second adhesive 42X situated inward in the horizontal direction (on the optical-axis side of the CM 2) with respect to the corner portion 60A (refer to an arrow D2).

Such a configuration also enables ultraviolet rays to penetrate into the deep portion in the fixing jig portion 3 with certainty, and enables the ultraviolet rays to be efficiently absorbed into the second adhesive 42X. Further, it is also possible to cause ultraviolet rays to be easily reflected off the curved light guiding surface 63 by performing the mirror finishing or the surface-roughness processing as described above with respect to the curved light guiding surface 63. This results in being able to accelerate the curing reaction of the entirety of the second adhesive 42X.

As described above, in the present embodiment, the configuration in which the light guiding surface 61 (63) is provided to the corner portion 60 (60A) of the fixing jig portion 3 is adopted for all of the four corner portions of the fixing jig portion 3. In other words, in the fixing jig portion 3, the light guiding surface 61 (63) is not limited to being formed in the corner portion of the second support portion 36 to which the CM 2 is fixed, but the light guiding surface 61 (63) is also formed in a corner portion of the first support portion 35 to which the CM 1 is fixed. This makes it possible to accelerate the curing reaction of the entirety of the first adhesive 41X used to fix the CM 1 when the first adhesive 41X has a photo-curable property, as in the case of the second adhesive 42X.

Note that the inclination angle of the inclined light guiding surface 61 of the corner portion 60, and the radius of curvature of the curved light guiding surface 63 of the corner portion 60A are set according to the size of the gap between the fixed jig 3 and the CM 2, the size of the fixed jig 3 or the housing 15 of the CM 2, or the like. Further, regarding the light guiding surface off which ultraviolet rays are reflected, for example, a member forming the light guiding surface may be prepared separately from the fixing jig portion 3, and the prepared member is attached to the fixing jig portion 3 to provide the light guiding surface.

[Surface to Which Second Adhesive is Applied]

Figure 14A:
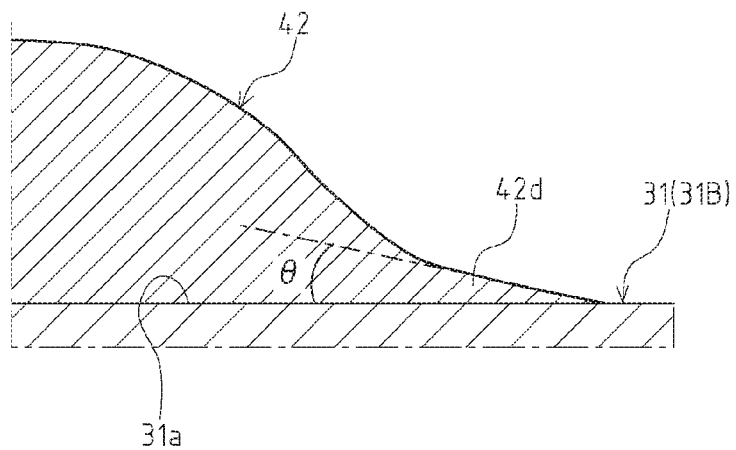
FIGS. 14A and 14B are diagrams describing a releasable property of an adhesive according to the embodiments of the present technology.

When the CM 2 is fixed to the fixing jig portion 3 in the image-capturing apparatus 1 according to the present embodiment, the second adhesive 42X is applied to a specified portion of a surface situated on the rear side of the fixing jig portion 3. Here, a surface, in the fixing jig portion 3, to which the second adhesive 42X is applied is primarily the back surface 31a of the second face portion 31B of the top face portion 31. When the surface to which the second adhesive 42X is applied has an enhanced wettability, a contact angle θ of the second adhesive 42X is small, as illustrated in FIG. 14A. When the contact angle θ is small, a thin-film portion 42d in the form of a thin film is formed on an edge of the second adhesive portion 42 obtained by the second adhesive 42X being cured.

Figure 14B:
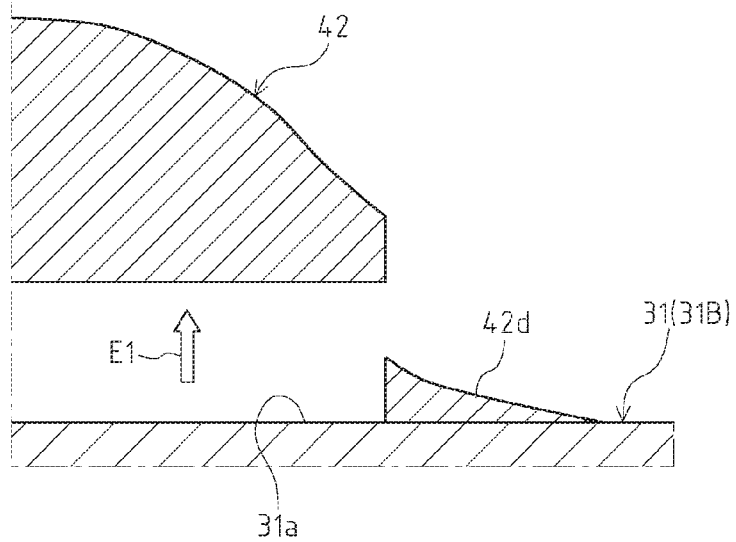

When the thin-film portion 42d is formed on the edge of the second adhesive portion 42 as described above, there is a possibility that the edge of the second adhesive portion 42 will be cracked when the second adhesive portion 42 is released from the back surface 31a of the second face portion 31B (refer to an arrow E1) in the process of removing the CM 2 described above, and that the thin-film portion 42d will remain on the back surface 31a of the second face portion 31B, as illustrated in FIG. 14B. In other words, the thin-film portion 42d may be separated from a main body of the second adhesive portion 42 released from the fixing jig portion 3, and the separated thin-film portion 42d may become a residue on the back surface 31a. As described above, when the surface to which the second adhesive 42X is applied has an enhanced wettability, the second adhesive portion 42 is not successfully released and a residue is likely to be caused in the process of removing the CM 2 described above. This may result in being unable to achieve a good releasable property for the second adhesive portion 42.

Thus, the image-capturing apparatus 1 according to the present embodiment includes a water-repellent portion 71 on an edge of a region, in the fixing jig portion 3, to which the second adhesive 42X is applied. On a surface, in the fixing jig portion 3, to which the second adhesive 42X is applied, the water-repellent portion 71 is provided such that at least a portion of a region surrounding a region to which the second adhesive 42X is applied, is edged with the water-repellent portion 71.

Figure 15:
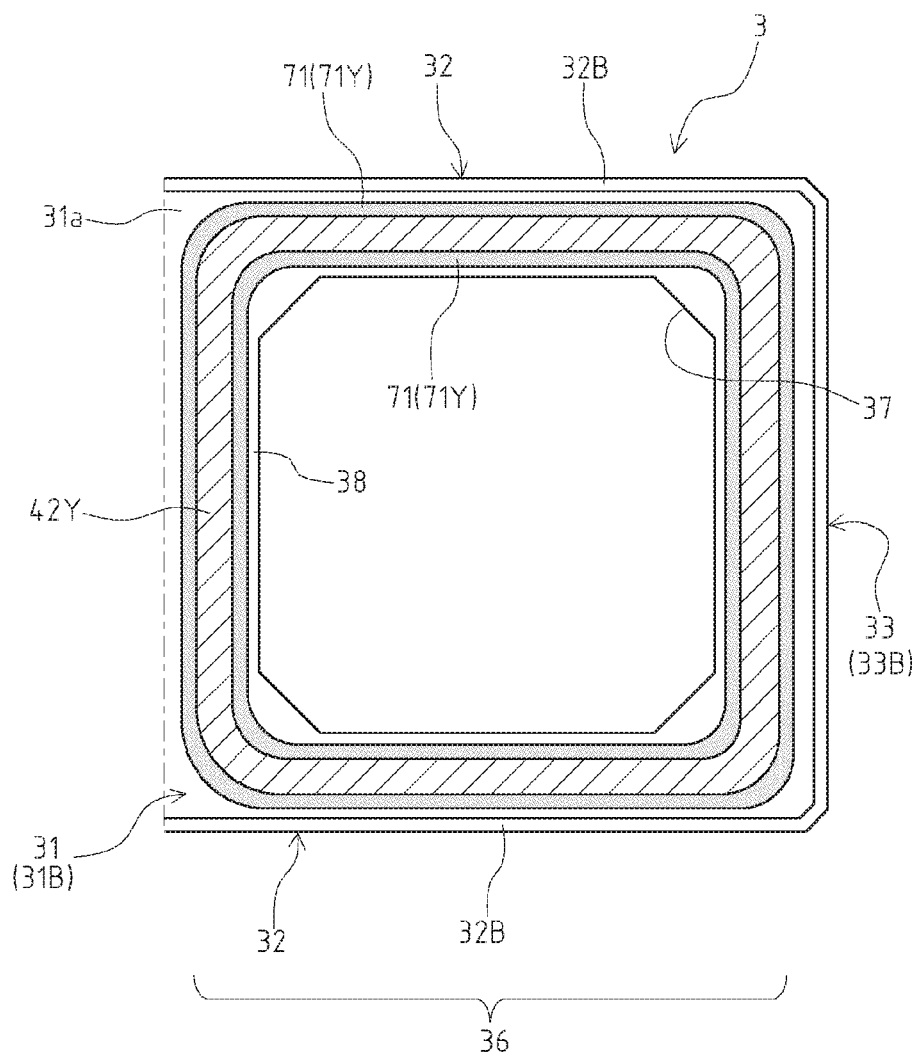
FIG. 15 illustrates a region, in the fixing jig portion, to which the adhesive is applied, and a portion, in the fixing jig portion, in which a water-repellent portion is formed according to the embodiments of the present technology.

Thus, as illustrated in FIG. 15, with respect to the second adhesive 42X applied in a rectangular-frame shape on the outside of the opening 37 of the fixing jig portion 3, the water-repellent portion 71 is provided to at least one of an inner periphery or an outer periphery of a hatched application region 42Y. In the example of FIG. 15, both a water-repellent portion 71X on the inner periphery of the application region 42Y and a water-repellent portion 71Y on the outer periphery of the application region 42Y are illustrated as the water-repellent portions 71. In particular, with respect to the inner periphery of the application region 42Y, the water-repellent portion 71 is provided in a substantially-rectangular-frame-shaped region surrounding the opening 37 on the back surface 31a of the second face portion 31B.

Figure 16:
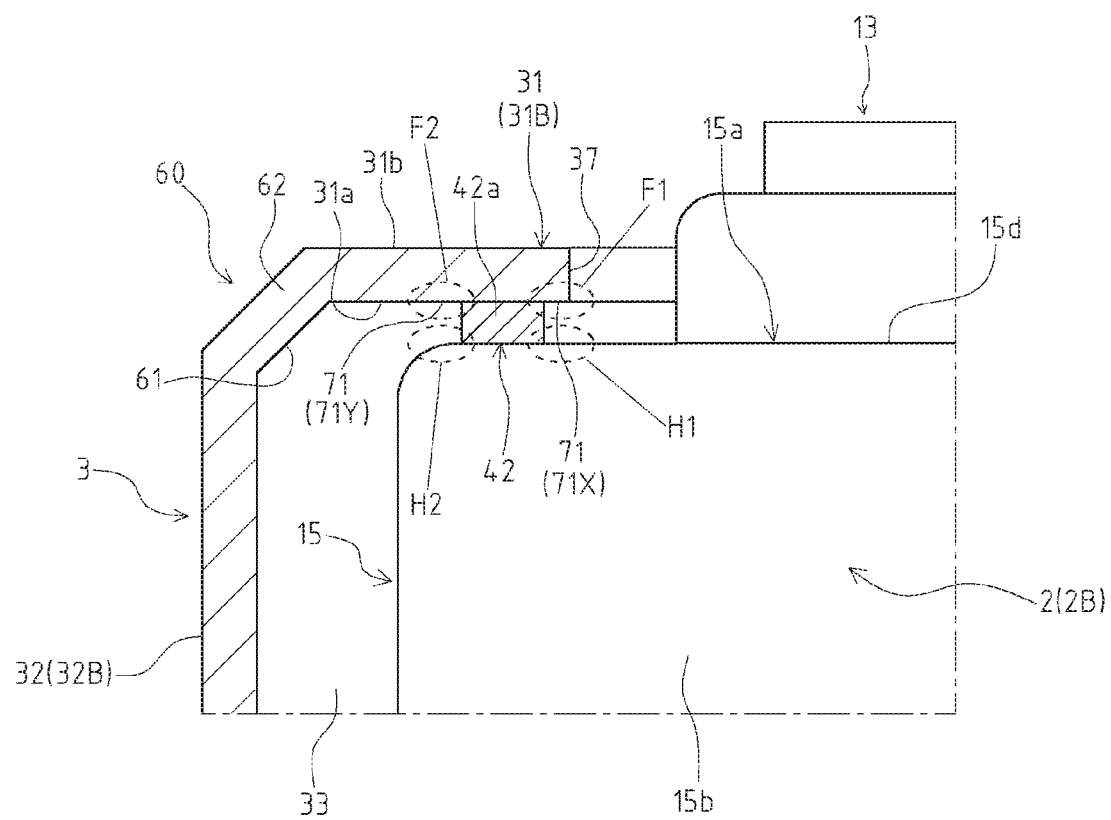
FIG. 16 is a diagram describing the portion in which the water-repellent portion is formed according to the embodiments of the present technology.

Specifically, for example, as illustrated in FIG. 16, the water-repellent portion 71X is provided in a portion (refer to the symbol F1) on the inner periphery (on the right in FIG. 16) of a portion, on the back surface 31a of the second face portion 31B, in which the first side portion 42a (refer to FIG. 6) of the second adhesive portion 42 is formed. Further, the water-repellent portion 71Y is provided in a portion (refer to the symbol F2) on the outer periphery (on the left in FIG. 16) of the portion in which the first side portion 42a is formed. Note that, likewise, the water-repellent portion 71 is provided in a portion on the outer periphery of a portion in which the second side portion 42b of the second adhesive portion 42 is formed and in a portion on the inner periphery of the portion in which the second side portion 42b of the second adhesive portion 42 is formed.

The water-repellent portion 71 is a portion on which water-repellent treatment has been performed, and is formed by performing water-repellent processing on a surface to which the second adhesive 42X is applied. For example, well-known processing such as surface-roughening processing by use of, for example shot blasting, polishing, or etching; and processing of coating with a material having a water-repellent property such as a silicon resin or a fluorine resin is used as the water-repellent processing.

Figure 17A:
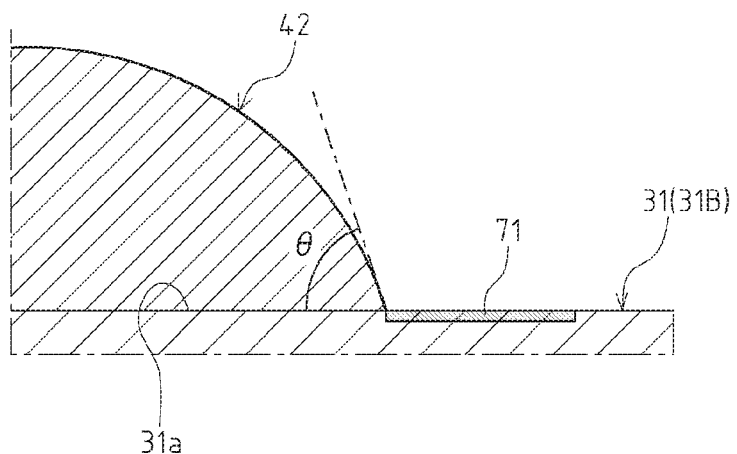
FIGS. 17A and 17B are diagrams describing the releasable property of the adhesive according to the embodiments of the present technology.

It is possible to reduce wettability in the water-repellent portion 71 with respect to the second adhesive 42X by providing the water-repellent portion 71 on an edge of a region to which the second adhesive 42X is applied, as described above. This makes it possible to make the contact angle θ of the second adhesive 42X large, as illustrated in FIG. 17A. When the contact angle θ is large, the thin-film portion 42d as illustrated in FIG. 14B is not likely to be formed on the edge of the second adhesive portion 42 obtained by the second adhesive 42X being cured.

Figure 17B:
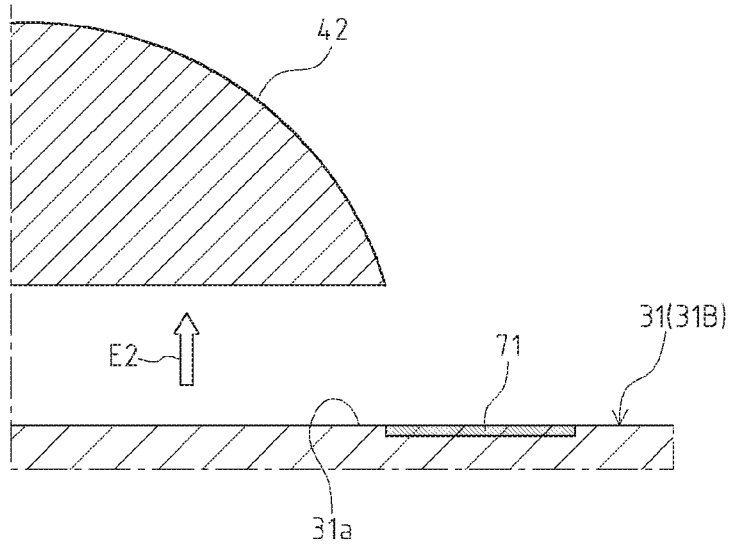

Thus, when the second adhesive portion 42 is released from the back surface 31a of the second face portion 31B in the process of removing the CM 2, it is possible to release the second adhesive portion 42 while preventing an edge of the second adhesive portion 42 from being cracked and preventing the thin-film portion 42d from remaining, as illustrated in FIG. 17B (refer to an arrow E2). In other words, a large contact angle θ of the second adhesive 42X makes it possible to set an outermost edge of the second adhesive portion 42 to be a start point of releasing the second adhesive portion 42, and thus to suppress the occurrence of a residue. This results in being able to achieve a good releasable property for the second adhesive portion 42. In particular, the configuration in which the water-repellent portion 71X on the inner periphery of the application region 42Y is provided as the water-repellent portion 71 makes it possible to suppress penetration of the second adhesive 42X into the side of the lens 14 of the CM 2. This results in being able to prevent the second adhesive 42X from affecting the CM 2.

Further, the water-repellent portion may be provided on an edge of a region, in the housing 15 of the CM 2, to which the second adhesive 42X is applied (a region with which the second adhesive 42X is brought into contact). In this case, on a surface, in the housing 15, to which the second adhesive 42X is applied (a surface with which the second adhesive 42X is brought into contact), the water-repellent portion is provided such that at least a portion of a region surrounding the region with which the second adhesive 42X is brought into contact, is edged with the water-repellent portion.

Thus, with respect to the second adhesive 42X existing in a region of a rectangular-frame shape on the outside of the opening 15c of the housing 15 of the CM 2, the water-repellent portion is provided to at least one of an inner periphery or an outer periphery of the region of a rectangular-frame shape. In particular, with respect to the inner periphery of the region of a rectangular-frame shape, the water-repellent portion is provided in a substantially-rectangular-frame-shaped region surrounding the opening 15c on the upper surface 15d of the housing 15.

Specifically, for example, as illustrated in FIG. 16, the water-repellent portion is provided in at least a portion (refer to the symbol H1) on the inner periphery (on the right in FIG. 16) of a portion, on the upper surface 15d of the housing 15, in which the first side portion 42a of the second adhesive portion 42 is formed, or a portion (refer to the symbol H2) on the outer periphery of the portion in which the first side portion 42a is formed. Note that, likewise, the water-repellent portion 71 is provided in a portion on the outer periphery of a portion in which the second side portion 42b of the second adhesive portion 42 is formed and in a portion on the inner periphery of the portion in which the second side portion 42b of the second adhesive portion 42 is formed.

The above-described configuration in which the water-repellent portion is provided in the housing 15 of the CM 2 makes it possible to achieve a good releasable property for the second adhesive portion 42 without causing a residue of the second adhesive portion 42 with respect to the housing 15 of the CM 2.

<Modification of Multi-ocular Image-Capturing Apparatus>

[First Modification]

A first modification of the image-capturing apparatus 1 according to the present embodiment is described. This modification is different from the embodiment described above in that the second adhesive portion 42 has a different shape in the configuration including the reinforcing resin portion 45 formed of a resin material filled into a space, between the fixing jig portion 3 and the CM 2, that is provided with the second adhesive portion 42.

The second adhesive 42X contains a special material such as a foamable filler such that the second adhesive 42X has a releasable property. When such a second adhesive 42X is used to fix the CM 2, dust or the like may be generated from the second adhesive portion 42. If dust or the like is generated from the second adhesive portion 42 after the image-capturing apparatus 1 is completed as a product, the dust or the like is reflected in an image-capturing screen. Thus, the image-capturing apparatus 1 according to this modification has the following configuration.

Figure 18:
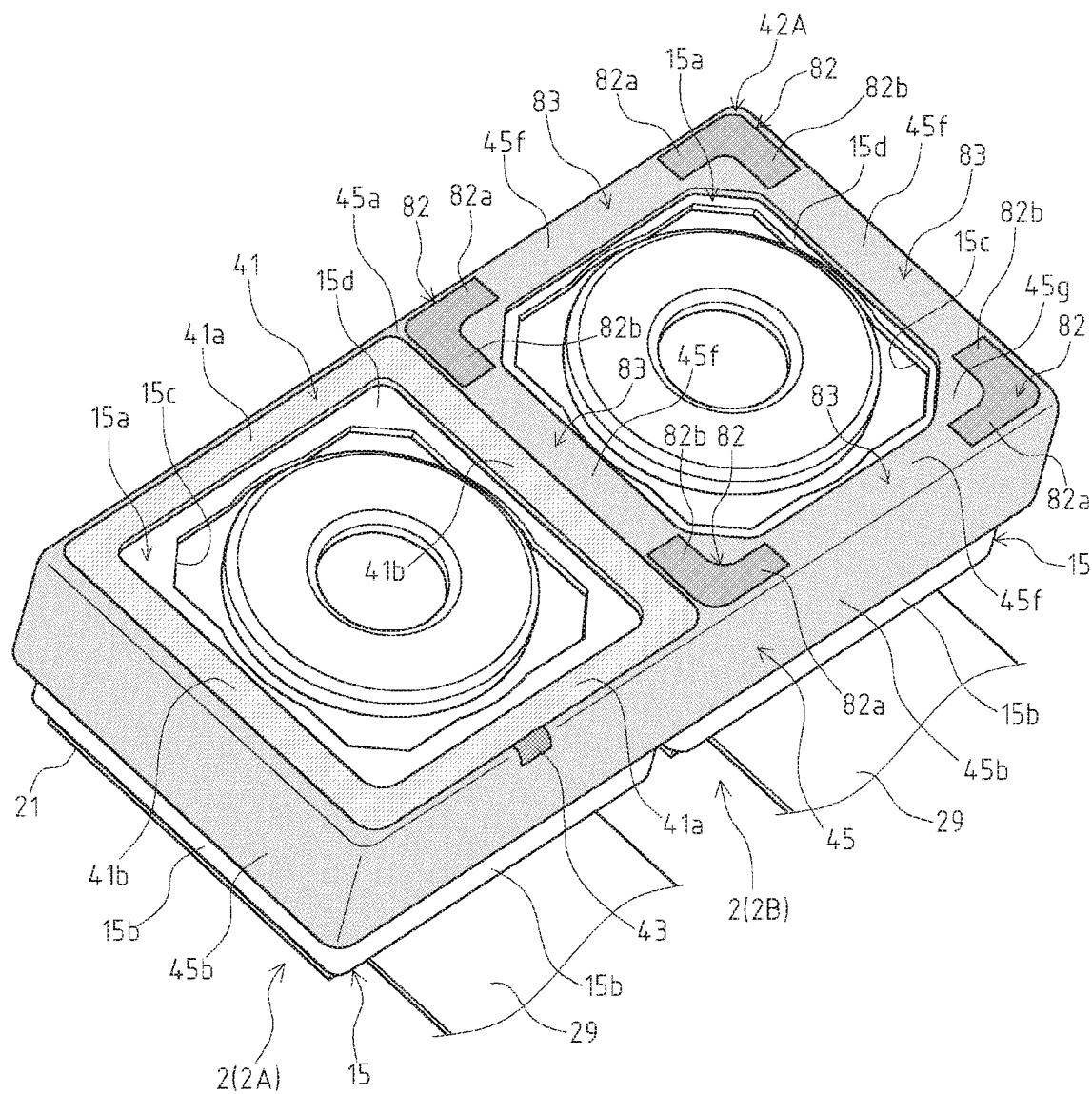
FIG. 18 illustrates a modification of the adhesive portion used to fix the camera module of the image-capturing apparatus according to the embodiments of the present technology.

As illustrated in FIG. 18, in the image-capturing apparatus 1 of this modification, a second adhesive portion 42A used to fix the CM 2 is provided in discontinuous regions on a surface to which the CM 2 is bonded. With respect to the second adhesive portion 42 formed in a rectangular-frame shape to surround the opening 37 (the opening 15c) in the configuration example described above, the second adhesive portion 42A is provided in the form of a plurality of discontinuous portions to surround the opening 37 in this modification. In other words, the second adhesive portion 42A has a floating-island structure. Here, in the present embodiment, the surface to which the CM 2 is bonded is primarily the back surface 31a of the second face portion 31B of the fixing jig portion 3.

Specifically, as illustrated in FIG. 18, L-shaped second-adhesive-portion elements 82 are respectively provided in four positions as the second adhesive portion 42A, the four positions corresponding to four corners of a rectangular frame-shaped region situated around the opening 37 (the opening 15c). Compared with the shape of the second adhesive portion 42 illustrated in FIG. 6, in this modification, a middle portion of each of the first side portion 42a and the second side portion 42b of the second adhesive portion 42 is a non-formation region in which the second adhesive portion 42 is not formed. Further, the second adhesive portion 42A has a discontinuous shape around the opening 37 (the opening 15c).

In particular, as illustrated in FIG. 18, each second-adhesive-portion element 82 forming the second adhesive portion 42A includes a first side portion 82a extending in the longitudinal direction of the fixing jig portion 3 and a second side portion 82b extending in the lateral direction of the fixing jig portion 3, and these side portions form a substantially "L" shape in a plan view. A non-formation region 83 in which the second adhesive portion 42A is not formed, is formed between the second-adhesive-portion elements 82 adjacent to each other in each of the longitudinal direction and the lateral direction of the fixing jig portion 3, the non-formation region 83 being a gap between the adjacent second-adhesive-portion elements 82.

According to the above-described configuration in which the second adhesive portion 42A is provided in the form of discontinuous portions to intentionally form a slit (the non-formation region 83), a reinforcing resin material filled into the fixing jig portion 3 after the CM 2 is fixed using the second adhesive portion 42A, penetrates further inward than the second adhesive portion 42A due to capillary action or the like, and surrounds the entirety of each second-adhesive-portion element 82. This results in also forming the reinforcing resin portion 45 further inward than the second adhesive portion 42A.

Specifically, as illustrated in FIG. 18, the reinforcing resin portion 45 in this modification includes a gap filling portion 45f and an inner-periphery reinforcement portion 45g in addition to a portion of the shape illustrated in FIG. 6, the gap filling portion 45f being formed in the non-formation region 83, the inner-periphery reinforcement portion 45g being formed on the inner periphery of the second adhesive portion 42A through the gap filling portion 45f, the gap filling portion 45f and the inner-periphery reinforcement portion 45g each being a portion continuous with the top face reinforcing portion 45a. The inner-periphery reinforcement portion 45g is a portion surrounding the opening 37 (the opening 15c).

Thus, the entirety of each second-adhesive-portion element 82 is surrounded by the top face reinforcing portion 45a, the gap filling portion 45f, and the inner-periphery reinforcement portion 45g of the reinforcing resin portion 45. In other words, each second-adhesive-portion element 82 is embedded in the reinforcing resin portion 45 in a top face portion of the reinforcing resin portion 45, and exists in the form of an island as viewed from the top-face side.

The above-described configuration of this modification makes it possible to envelop each second-adhesive-portion element 82 in the reinforcing resin portion 45, and thus to suppress generation of dust from the second adhesive portion 42A. In other words, even if dust is generated from the second adhesive portion 42A, it is possible to prevent the side of the lens 14 of the CM 2 from being affected by the dust since the second adhesive portion 42A is covered with the reinforcing resin portion 45. Further, compared with the case of forming the second adhesive portion 42 to surround the entirety of the opening 37 (the opening 15c), the configuration of this modification makes it possible to reduce the amount of the second adhesive 42X due to the presence of the non-formation region 83. This results in being able to save the second adhesive 42X, which leads to a reduction in costs.

Further, in the configuration of this modification, it is possible to provide a water-repellent treatment portion, such as the water-repellent portion 71 described above, in a portion further inside of the inner-periphery reinforcement portion 45g of the reinforcing resin portion 45 on at least one of the upper surface 15d of the housing 15, or the back surface 31a of the second face portion 31B. Such a configuration makes it possible to suppress penetration of a reinforcing resin material into the side of the lens 14 of the CM 2. This results in being able to prevent the reinforcing resin portion 45 from affecting the CM 2.

Note that the formation of the second adhesive portion 42A having a discontinuous shape is not limited to the example illustrated in FIG. 18, and it is sufficient if, around the opening 37 (the opening 15c), the second adhesive portion 42A has a shape having a gap such as the non-formation region 83. In other words, it is sufficient if the second adhesive portion 42A has a shape having a gap that causes an inner portion and an outer portion of the second adhesive portion 42A to communicate with each other. Such a configuration enables a reinforcing resin material to penetrate into the inner periphery of the second adhesive portion 42A from the outer periphery of the second adhesive portion 42A through the gap. This results in being able to envelop the second adhesive portion 42A in the reinforcing resin material penetrating into the inside of the second adhesive portion 42A.

[Second Modification]

A second modification of the image-capturing apparatus according to the present embodiment is described. An image-capturing apparatus 1A of this modification includes two second camera modules 2B which are fixed using the second adhesive 42X having a releasable property. In other words, as illustrated in FIG. 19, the image-capturing apparatus 1A includes one first camera module 2A and two second camera modules 2Bx and 2By as the camera modules 2 fixed to a fixing jig portion 3A.

Figure 19:
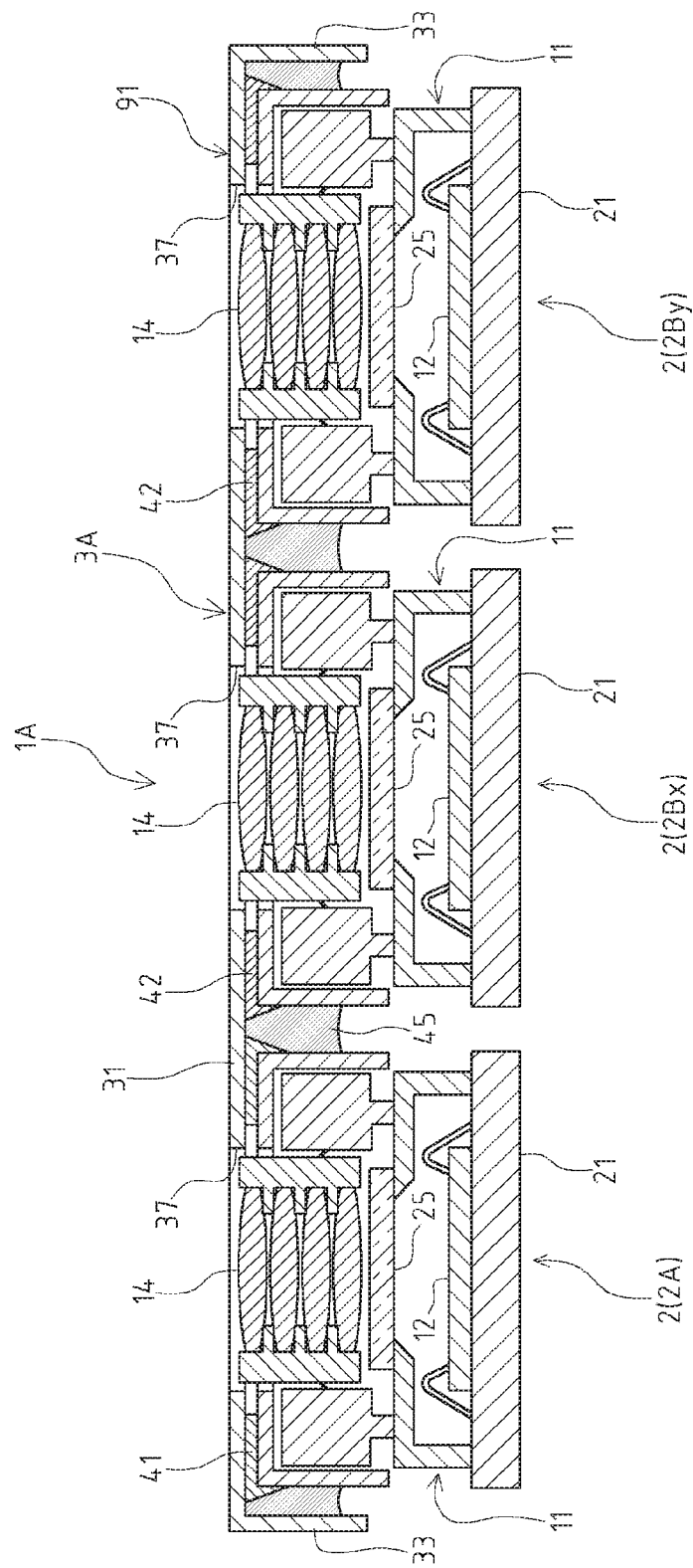
FIG. 19 is a cross-sectional view schematically illustrating a modification of the configuration of the image-capturing apparatus according to the embodiments of the present technology.

Compared to the above-described configuration in which two camera modules 2 are included (refer to FIG. 2), the fixing jig portion 3 in this modification is extended on the side of the second camera module 2B (on the left in FIG. 2), and a third support portion 91 that supports the secondly provided second camera module 2By is included, as illustrated in FIG. 19. In other words, three camera modules 2 arranged in series in order of the first camera module 2A, the firstly provided second camera module 2Bx, and the secondly provided second camera module 2By are supported by being fixed to the fixing jig portion 3A in this configuration example. Further, the fixing jig portion 3A is formed to be substantially symmetric in a longitudinal direction (a left-right direction in FIGS. 10A, 10B, and 10C), in which the three camera modules 2 are substantially symmetrically arranged to be supported by the fixing jig portion 3A.

The two second camera modules 2Bx and 2By are fixed to the fixing jig portion 3A with the same fixing structure by the same fixing method as the second camera module 2B in the above-described configuration example. In other words, the two second camera modules 2Bx and 2By are fixed to the fixing jig portion 3A using the second adhesive portion 42 formed of the second adhesive 42X having the property of being released in a specified temperature range. Further, when the respective second camera modules 2Bx and 2By are fixed to the fixing jig portion 3A, alignment (an optical-axis adjustment) is performed in a specified order or at the same time, using, as a reference, the optical axis of the CM 1 fixed to the fixing jig portion 3 earlier. In the configuration of this modification, both of the two second camera modules 2Bx and 2By may be a removal target of the process of removing the CM 2.

As describe above, the image-capturing apparatus according to the present technology is also applicable to a configuration in which a plurality of second camera modules is included, and it is possible to selectively release the plurality of second camera modules. Note that the three camera modules 2 are not limited to being arranged in series, as illustrated in FIG. 19, and, for example, the three camera modules 2 may be arranged such that each camera module 2 is situated at a vertex of a triangular shape in a plan view.

<5. Configuration Example of Electronic Apparatus>

An example of applying the image-capturing apparatus 1 according to the present embodiment to an electronic apparatus is described. The image-capturing apparatus 1 is applicable by being incorporated into various electronic apparatuses, such as an image-capturing system such as a digital still camera or a video camera, a portable terminal apparatus including an image-capturing function, and a copying machine using a solid-state imaging device for an image reader.

Figure 20:
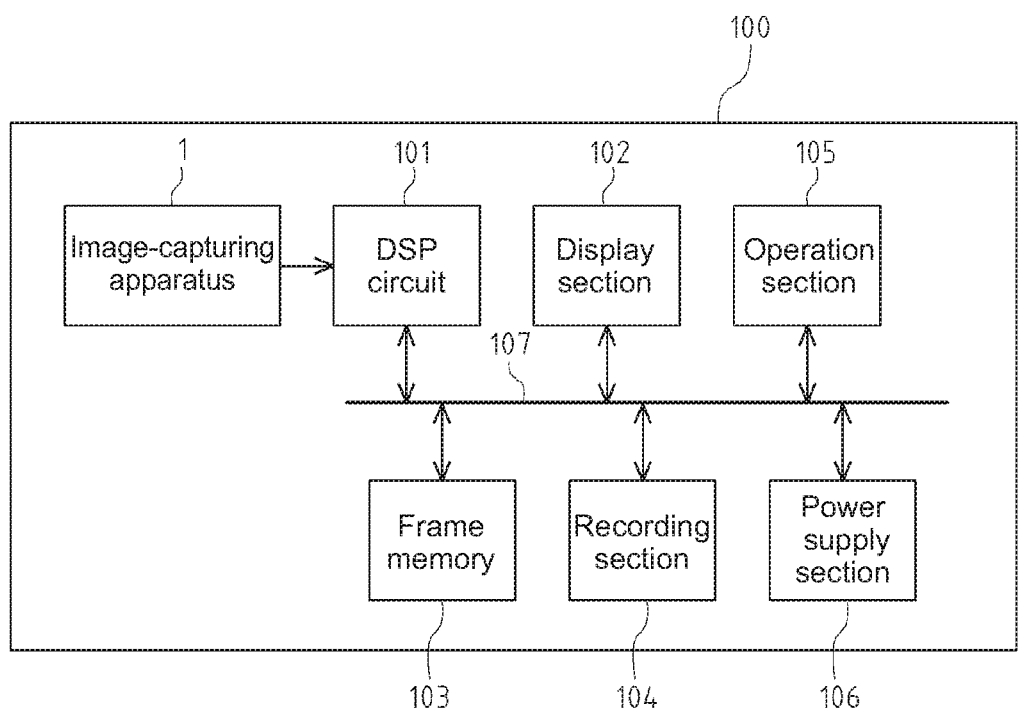
FIG. 20 is a block diagram illustrating a configuration example of an electronic apparatus that includes the image-capturing apparatus according to the embodiments of the present technology.

As illustrated in FIG. 20, an electronic apparatus 100 includes the image-capturing apparatus 1, a digital signal processor (DSP) circuit 101 that is a camera signal processing circuit, a frame memory 102, a display section 103, a recording section 104, an operation section 105, and a power supply section 106. The DSP circuit 101, the frame memory 102, the display section 103, the recording section 104, the operation section 105, and the power supply section 106 are connected to each other through a bus line 107.

The image sensor 12 included in each camera module 2 of the image-capturing apparatus 1 captures incident light from a subject (image light), converts, into an electric signal per pixel, an amount of the incident light of which an image is formed on an imaging surface, and outputs the electric signal as a pixel signal.

The display section 103 is formed of, for example, a panel display apparatus such as a liquid crystal panel or an organic electroluminescence (EL) panel, and displays thereon a moving image or a still image captured by the image sensor 12. The recording section 104 records the moving image or the still image captured by the image sensor 12 on a recording medium such as a hard disk or a semiconductor memory.

The operation section 105 issues an operation command for various functions of the electronic apparatus 100 in response to an operation performed by a user. The power supply section 106 supplies power to each of the DSP circuit 101, the frame memory 102, the display section 103, the recording section 104, and the operation section 105 as appropriate, the supplied power being used to operate these supply targets.

The electronic apparatus 100 described above make it possible to suppress a reduction in yield and to reduce production costs even when a failure has occurred with respect to the alignment and the like of the camera module 2 in the image-capturing apparatus 1 including a plurality of camera modules 2.

The descriptions of the embodiments described above are examples of the present disclosure, and the present disclosure is not limited to the embodiments described above. Thus, of course, various modifications may be made depending on the design and the like without departing from the technical idea according to the present disclosure even in the case of an embodiment other than the embodiments described above. Further, the effects described in the present disclosure are not limitative but are merely illustrative, and other effects may be provided.

In the embodiments described above, the CMOS image sensor 12 has been described as an example of a solid-state imaging device included in each camera module 2. However, the present technology is widely applicable to a camera module including a solid-state imaging device of a type other than the CMOS type, such as a CCD type.

Note that the present technology may also take the following configurations.

(1) An image-capturing apparatus, including:
 a plurality of camera modules; and a support member used to support the plurality of camera modules in a specified positional relationship, the image-capturing apparatus including a first camera module and at least one second camera module as the plurality of camera modules, the first camera module being fixed to the support member, the at least one second camera module being fixed to the support member using an adhesive portion formed of an adhesive that has a property of being released in a specific temperature range.

(2) The image-capturing apparatus according to (1), in which the specific temperature range is from 85° C. to 100° C.

(3) The image-capturing apparatus according to (1) or (2), in which
the adhesive has a photo-curable property,
at least a portion, in the support member, to which the second camera module is fixed includes a first face portion and a second face portion, the adhesive being situated in a space between the first face portion and the second camera module, the first face portion and the second face portion forming a corner portion, and
the image-capturing apparatus further includes a light guiding surface in the corner portion, the light guiding surface being used to guide light to the space between the first face portion and the second camera module, the light being used to cure the adhesive.

(4) The image-capturing apparatus according to any one of (1) to (3), further including
a water-repellent portion on an edge of a region in at least one of the support member or the second camera module, the region being a region to which the adhesive is applied.

(5) The image-capturing apparatus according to any one of (1) to (4), further including
a reinforcing resin portion formed of a resin material filled into a space between the support member and the camera module, the space being provided with the adhesive portion, in which
the adhesive portion is provided in discontinuous regions on a surface to which the second camera module is bonded.

(6) An electronic apparatus, including
an image-capturing apparatus including
a plurality of camera modules, and
a support member used to support the plurality of camera modules in a specified positional relationship, the image-capturing apparatus including a first camera module and at least one second camera module as the plurality of camera modules, the first camera module being fixed to the support member, the at least one second camera module being fixed to the support member using an adhesive portion formed of an adhesive that has a property of being released in a specific temperature range.

(7) A method for producing an image-capturing apparatus, the method including:
fixing a first camera module to a support member used to support a plurality of camera modules in a specified positional relationship;
fixing a second camera module to the support member using an adhesive that has a property of being released in a specific temperature range;
performing an inspection for quality with respect to a multi-ocular module in which the first camera module and the second camera module are fixed to the support member, the quality including a state of attachment of the second camera module to the support member;
when the multi-ocular module has been determined to be a non-defective product in the inspection, forming a reinforcing resin portion by filling a resin material into a space between the support member and the camera module; and
when the multi-ocular module has been determined to be a defective product in the inspection, removing the second camera module from the support member by heating the adhesive portion at a temperature in the specific temperature range and by releasing the adhesive portion, and fixing the second camera module.

REFERENCE SIGNS LIST 1 image-capturing apparatus
2 camera module
2A first camera module
2B second camera module
3 fixing jig portion (support member)
31 top face portion (first face portion)
32 longitudinal-side side wall (second face portion)
33 lateral-side side wall (second face portion)
42 second adhesive
42A second adhesive
45 reinforcing resin portion
60 corner portion
60A corner portion
61 light guiding surface
63 light guiding surface
71 water-repellent portion
82 second-adhesive-portion element
100 electronic apparatus

The invention claimed is:

1. An image-capturing apparatus, comprising:
a plurality of camera modules comprising a first camera module and at least one second camera module; and
a support member configured to support the plurality of camera modules in a specified positional relationship, wherein
the first camera module is fixed to the support member,
the at least one second camera module is fixed to the support member using an adhesive portion formed of an adhesive that has a property of being released in a specific temperature range,
at least a portion, in the support member, to which the at least one second camera module is fixed includes a first face portion and a second face portion,
the adhesive is in a space between the first face portion and the at least one second camera module, and
the first face portion and the second face portion form a corner portion.

2. The image-capturing apparatus according to claim 1, wherein the specific temperature range is from 85° C. to 100° C.

3. The image-capturing apparatus according to claim 1, wherein the adhesive has a photo-curable property,
the image-capturing apparatus further comprises a light guiding surface in the corner portion, the light guiding surface being used to guide light to the space between the first face portion and the at least one second camera module, the light is used to cure the adhesive.

4. The image-capturing apparatus according to claim 1, further comprising a water-repellent portion on an edge of a region in at least one of the support member or the at least one second camera module, wherein the adhesive is applied to the region.

5. The image-capturing apparatus according to claim 1, further comprising a reinforcing resin portion formed of a resin material which is filled into a space between the support member and the at least one second camera module, wherein the space between the support member and the at least one second camera module is provided with the adhesive portion, and the adhesive portion is provided in discontinuous regions on a surface to which the at least one second camera module is bonded.

6. An electronic apparatus, comprising:

an image-capturing apparatus including:

a plurality of camera modules comprising a first camera module and at least one second camera module; and a support member configured to support the plurality of camera modules in a specified positional relationship, wherein the first camera module is fixed to the support member, the at least one second camera module is fixed to the support member using an adhesive portion formed of an adhesive that has a property of being released in a specific temperature range, at least a portion, in the support member, to which the at least one second camera module is fixed includes a first face portion and a second face portion, the adhesive is in a space between the first face portion and the at least one second camera module, and the first face portion and the second face portion form a corner portion.

* * * * *